(12) United States Patent
Ahrikencheikh

(10) Patent No.: US 6,873,147 B2
(45) Date of Patent: Mar. 29, 2005

(54) OPTIMIZED PIN ASSIGNMENT WITH CONSTRAINTS

(75) Inventor: Cherif Ahrikencheikh, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/602,339

(22) Filed: Jun. 24, 2003

(65) Prior Publication Data

US 2004/0263152 A1 Dec. 30, 2004

(51) Int. Cl.[7] .............................................. G01R 31/26
(52) U.S. Cl. .................................... 324/158.1; 324/765
(58) Field of Search ............................. 324/765, 158.1, 324/757, 754, 761, 762, 73.1

(56) References Cited

U.S. PATENT DOCUMENTS 6,477,682 B2 * 11/2002 Cypher ........................ 714/805
6,744,262 B2 * 6/2004 Adamian ..................... 324/638

* cited by examiner

Primary Examiner—Michael Tokar
Assistant Examiner—Tung X. Nguyen

(57) ABSTRACT

A novel method for finding optimized solutions for assigning pins to probes in a constrained tester environment is presented. Given a test system network, including the nodes, probes, pins, resources, probe-to-resource mappings, resource-to-pin mappings, and test-to-resource mappings, and constraints including a Multiple-Resource-Per-Probe Constraint, a Same-Module Constraint, and/or a Multiplexing Constraint, the test system network is modeled as a Network Flow Problem to handle all of the constraints of the constrained pin-to-probe assignment problem, using "dummy" probes where necessary to model the constrained network. A modified Maximum Flow Algorithm that satisfies the network constraints is applied to the Network Flow Problem to generate a solution to said constrained pin-to-probe assignment problem.

24 Claims, 15 Drawing Sheets

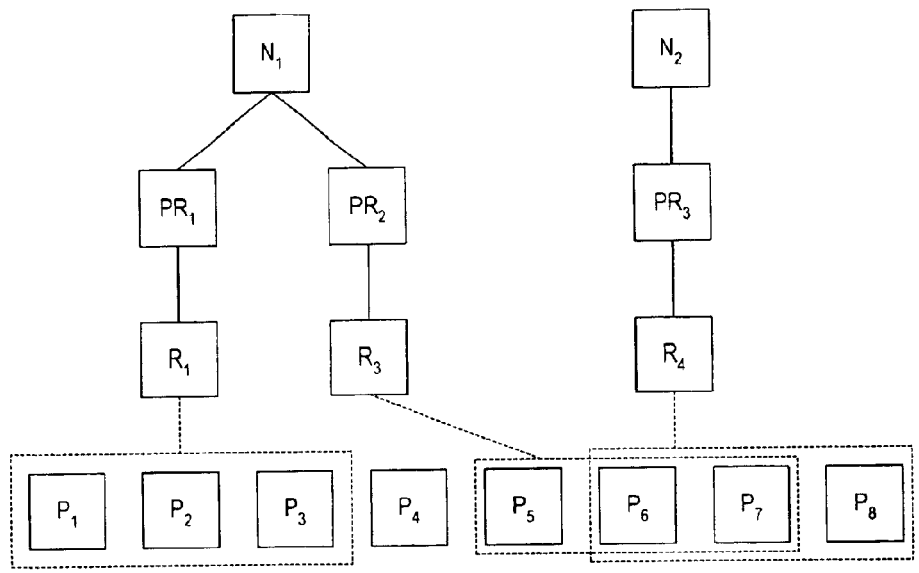
FIG. 3A
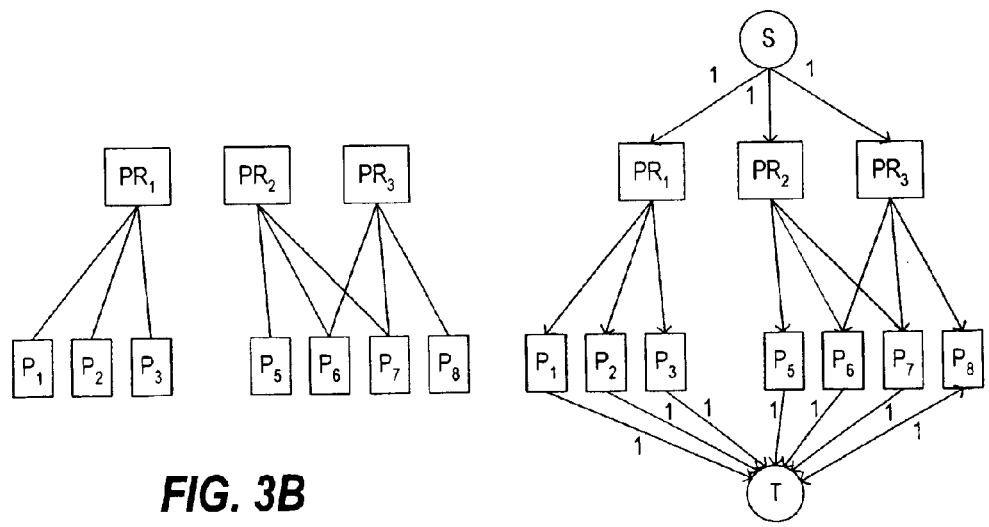
FIG. 3B
FIG. 3C

OPTIMIZED PIN ASSIGNMENT WITH CONSTRAINTS

BACKGROUND OF THE INVENTION

The present invention relates generally to electrical board testers, and more particularly to an algorithm for finding optimized solutions for assigning pins to probes in a constrained tester environment.

The increasing reliance upon computer systems to collect, process, and analyze data has intensified the need for reliable testing of the printed circuit boards that make up such systems. To accomplish this, industrial printed circuit board (PCB) testers are used to exhaustively test PCBs after manufacture.

Printed circuit board testers are complex machines. A typical PCB tester includes an array of tester interface pins arranged in a static configuration. The tester includes internal test hardware for configuring the connection of internal test resources to various tester interface pins. Because the locations of the tester interface pins rarely match up with the locations of the nodes of interest on a given PCB under test when the PCB under test is mounted in the tester due to the static configuration shape and pin spacing, the tester typically includes a test fixture. The test fixture includes a set of test probes that line up with the nodes of interest on the PCB under test. The probes in turn are electrically connected (for example, via a wireless (or PCB) fixture adapter) to the test interface pins when the fixture is mounted on the tester.

Prior to running a given test, the tester resources must be configured to be able to apply stimuli and receive responses appropriate to the test on various pins. One of the tasks in configuring the tester resources for a given test is to assign tester interface pins to appropriate probes of the fixture. Due to tester wiring, there are typically several constraints to satisfy in choice of pin-to-probe assignments. This type of problem is referred to herein as the "constrained pin-to-probe assignment problem".

The following rules and constraints, referred generally hereinafter as the pin-to-probe assignment "constraints" define the constrained pin-to-probe assignment problem:

Pin-to-Probe Assignment Problem Constraints

1. Probes-Needed-Per-Node Constraint: A set $\{N_i\}$ of nodes needing resources delivered to them and/or measured from them via probes $\{PR_i\}$ with known locations. "Known location" implies known x-y-z-coordinates in a well-defined reference system. FIG. 1 is a high-level schematic of an example test system network used to illustrate the pin-to-probe assignment problem. As illustrated in FIG. 1, node $N_1$ uses two probes $PR_1$ and $PR_2$, and $N_2$ uses one probe $PR_3$. The probes $PR_1$, $PR_2$, and $PR_3$ actually connect to the respective nodes $N_1$ and $N_2$ during a test.

2. Resources-Required-Per-Node Constraint: A set $\{R_i\}$ of the resources (e.g., tester stimulus or measurement circuits) needed by each node. In FIG. 1, $N_1$ needs $R_1$, $R_2$ and $R_3$, and $N_2$ needs $R_4$ and $R_5$. Also, in the example of FIG. 1, probe $PR_1$ is a conduit for resources $R_1$ and $R_2$, probe $PR_2$ handles $R_3$, and $PR_3$ handles $R_4$ and $R_5$.

3. Multiple-Resource-Per-Probe Constraint: A set $\{T_i\}$ of non-disjoint groupings of resources where each grouping realizes a test. In the example of FIG. 1, test $T_1$ uses $R_1$, $R_2$ and $R_3$, while test $T_2$ uses $R_3$, $R_4$ and $R_5$. A probe can handle one resource for one test and the same or a different resource for another test. However, a probe can handle only one resource in the same test.

4. Pins-Available-To-Deliver-Resource Constraint: A set $\{L_i\}$ of 1-to-many mappings describing which pins of a set $\{P_i\}$ can deliver each resource. In the example of FIG. 1, pins $P_1$, $P_2$, $P_3$ can deliver $R_1$.

5. Same-Module Constraint: The pins of the set $\{P_i\}$ are sometimes physically grouped into modules. In these situations, there can be a subset $\{t_i\}$ of tests where each test $t_i$ requires that the resources it utilizes be delivered/measured from pins of the same module.

6. One-Pin-Per-Node Constraint: No two nodes can share a pin (otherwise the two nodes short to each other during test).

7. Multiplexing Constraint: A set $\{M_{ij}\}$ of disjoint pin groupings describing which pins are multiplexed together and cannot be used simultaneously in the same test. This constraint can be specified on a per-resource level; that is, for each resource k, establish the set $\{M_{ij}\}_k$ of disjoint groupings of pins that can not be used simultaneously in a test. For example, pins P2 and P3 could be multiplexed (shown with a circle in FIG. 1). In this case using P2 to deliver resource R1 in test T1 forbids using P3 to deliver resource R2 in the same test.

The pin-to-probe assignment problem is to assign tester interface pins to tester fixture probes (hereinafter "pins-to-probes") while satisfying all the above constraints.

In the past, pin assignment has followed a "sequential" approach in which probes are selected sequentially one after another, sometimes after being ordered based on the criticality (such as electrical sensitivity) of their nodes. For each probe, a pin is assigned, usually the pin closest to the probe and for which the multiplexing and same-module constraints are satisfied. The algorithm proceeds sequentially through the probes until pins are assigned to all of them, or it is determined that the pool of pins is not sufficient. In the latter case, additional pins must be provided to complete the assignment.

FIGS. 2A, 2B, and 2C illustrate a simple pin-to-probe assignment example. In FIG. 2A, probe $PR_1$ can possibly be assigned to pins $P_1$ and $P_2$, while probe $PR_2$ can possibly be assigned only to pin $P_2$. If the pin-to-probe assignment algorithm adheres to the sequential approach described above, then if probe $PR_1$ is handled first by the algorithm and assigned to pin $P_2$ (perhaps because it is the closest to it), then clearly probe $PR_2$ cannot be assigned to any pin without violating the constraint that no two nodes can share a pin (One-Pin-Per-Node Constraint) as shown in FIG. 2B. The sequential assignment algorithm will conclude that the pool of pins is not sufficient. On the other hand, if probe $PR_2$ is handled first and assigned pin $P_2$, then probe $PR_1$ would be assigned pin $P_1$ as shown in FIG. 2C, and the pool of pins would be sufficient. Therefore, one drawback of "sequential" approaches is the lack of "look-ahead" to maximize the number of probes that can be assigned from a fixed pool. In turn, this approach cannot determine, for example, the smallest pool of pins that is necessary to assign all the probes. The "optimized" constrained pin assignment problem is to select the "best" solution, where "best" signifies optimizing based on a given criterion. Thus, if the criterion is either assigning the smallest pool of pins from a fixed pool of pins, or finding the maximum number of probes that can be assigned from a fixed pool, then clearly having "look-ahead" capability built into the assignment algorithm could allow the formulation of an optimal solution, if one indeed exists. Other "optimization" criteria could also be undertaken if the "look ahead" were possible.

Accordingly, it would be desirable to have a pin-to-probe assignment algorithm that implements some form of look-ahead capability. In addition, because there can be more than one solution for such an assignment, it would also be desirable to be able to generate an optimum pin assignment solution based on given "optimization" criteria.

SUMMARY OF THE INVENTION

The present invention describes an algorithm for finding optimized solutions for the constrained pin-to-probe assignment problem. In accordance with the invention, the test system network, including the nodes, probes, pins, resources, probe-to-resource mappings, resource-to-pin mappings, and test-to-resource mappings, is modeled as a Network Flow Problem to handle all of the constraints of the constrained pin-to-probe assignment problem. To this end, for handling the Multiple-Resource-Per-Probe Constraint, all probes that are designed to handle multiple resources in the test system network are temporarily re-mapped to create a one-to-one mapping between probes and resources by creating an appropriate number of "dummy" probes associated with each probe that handles multiple resources. Additionally, in order to handle the Same-Module Constraint for tests that require all resources to be in the same module, the appropriate number of "dummy" probes associated with each probes that handles the resources of the constrained test are created to duplicate the probes of the test over each available module. Probes handling resources that are used only by non-constrained tests are mapped only to pins of the associated module. Probes that handle resources that are used by non-constrained tests are mapped to pins of each module.

A novel algorithm based on the Maximum Flow Algorithm but modified to account for the additional constraints of the constrained pin-to-probe assignment problem is used to automatically find a solution to the Network Flow Problem model of the test system network. Preferably, the Maximum Flow Algorithm also keeps track of the cost associated with each flow solution of the modified Network Flow Problem model to generate an optimum solution for the network.

Once a solution is selected, the cost of the pin-to-probe links for probes handling resources constrained to the same module by a given test are weighed to select the least-cost solution from a single module. The unselected "duplicate" paths are then removed from the solution. All remaining "dummy" probes (created to account for the Multiple-Resource-Per-Probe Constraint), are then replaced with their associated "real" probes in the solution. The final solution thus contains an optimum pin-to-probe assignment solution for the constrained pin-to-probe assignment problem.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 3A is a high-level network diagram of the example test system network of FIG. 1 modified to map each probe to only a single resource;

FIG. 3B is an equivalent Matching Problem diagram of the network of FIG. 3A;

FIG. 3C is an equivalent Network Flow diagram of the matching problem of FIG. 3B;

DETAILED DESCRIPTION

For greater understanding of the novel aspects of the invention discussed hereinafter, a consideration of certain key graph theory techniques is first presented.

In order to differentiate between discussion of the test system network and graph theory problems such as the Matching Problem and the Network Flow Problem, the terms "node" and "links" will be used when referring to a test system network, whereas the terms "vertex" and "edge" will be used in reference to a Matching Problem diagram or Network Flow Problem diagram throughout the following detailed description.

III. Simplified Pin-to-Probe Assignment Problem a. The Matching Problem

A simplified approach to the problem of assigning pins to probes involves a graph theory problem known as the "Matching Problem". In general terms, given a graph G=(V, E), where V is the set of vertices and E is the set of edges connecting vertices in V, a subset of the edges in E with no two edges incident upon the same vertex in V is called a "matching". A graph comprising a matching solution with a maximum subset of such edges is called a "maximal matching".

Many techniques exist for solving the Matching Problem. One straightforward method for finding a maximal matching is to generate all matchings and then select one of the matchings that has the maximum number of edges. This method has the disadvantage that the running time of the algorithm is an exponential function of the number of edges E in a graph G defined by a set of vertices V and edges E.

In the preferred embodiment, the Matching Problem is solved using Network Flow techniques. To the end, the Matching Problem is converted to what is known in graph theory as the Network Flow Problem. Network Flow Problem solution techniques not only have efficiency advantages (with a typical running time that is a simple polynomial function of the number of edges E in the graph G=(V,E)), but also take into account the costs of the paths (such as assignment quality or electrical sensitivity) to determine an "optimized" solution. In the Network Flow Problem, the test system network is considered in terms of input flow versus output flow.

Figures 1, 2A, 2B, 2C:
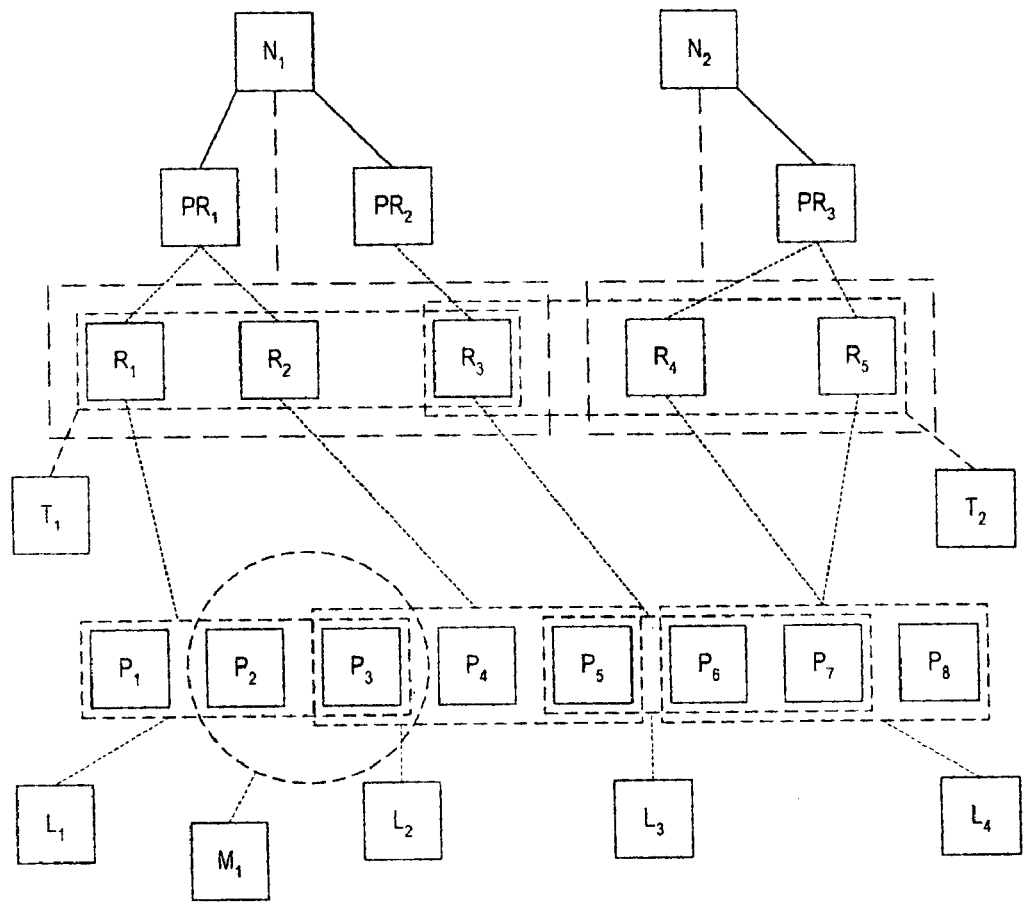
FIG. 1 is a high-level schematic block diagram of an example test system network used to illustrate a pin-to-probe assignment problem to be solved by the present invention.
FIG. 2A is a high-level network diagram of a simple example pin-to-probe assignment problem.
FIG. 2B is a high-level assignment diagram illustrating a proposed pin-to-probe assignment problem solution that violates a pin-to-probe assignment constraint.
FIG. 2C is a high-level assignment diagram illustrating a proposed pin-to-probe assignment problem solution that does not violate the pin-to-probe assignment constraints.

Turning attention now to the original test system network schematic of FIG. 1, it may be apparent that if the schematic were simplified, one could apply the techniques described above to come up with a partial solution to the pin-to-probe assignment problem. More particularly, FIG. 3A shows the schematic of a simplified model of the system connections of FIG. 1, simplified such that each probe handles only one resource. As shown in the simplified model of FIG. 3A, node $N_1$ uses two probes $PR_1$ and $PR_2$, and node $N_2$ uses one probe $PR_3$. In this model, probe PR1 is now a conduit for resource $R_1$ only, probe $PR_2$ handles resource $R_3$, and probe $PR_3$ handles only resource $R_4$. Pins $P_1$, $P_2$, $P_3$ can deliver/measure resource $R_1$, pins $P_5$, $P_6$, $P_7$ can deliver/measure resource $R_3$, and pins $P_6$, $P_7$, $P_8$ can deliver/measure resource $R_4$.

Pins $P_1$, $P_2$, $P_3$, $P_4$, $P_5$, $P_6$, $P_7$, $P_8$ and probes $PR_1$, $PR_2$, $PR_3$ are members of two disjoint sets, and the problem is to assign pins to probes with a one-to-one mapping. Accordingly, the problem may be modeled in a bipartite-graph representation of the corresponding "Matching Problem", as shown in FIG. 3B.

In this regard, the bipartite graph representation of the Matching Problem as shown in FIG. 3B (with all probes $PR_m$ (where m=1 to 3) in one set $V_1$ of vertices, and all pins $P_n$ (where n=1 to 8) in a second disjoint set $V_2$ of vertices) is converted to an equivalent Network Flow Problem shown in FIG. 3C by creating a source vertex S having a directed edge from the source vertex S to each of the vertices $PR_m$ in $V_1$, directing each of the existing edges from vertices $PR_m$ in $V_1$ to vertices $P_n$ in $V_2$, and creating a sink vertex T having a directed edge from each of the vertices $P_n$ in $V_2$ to the sink vertex T.

Figure 4:
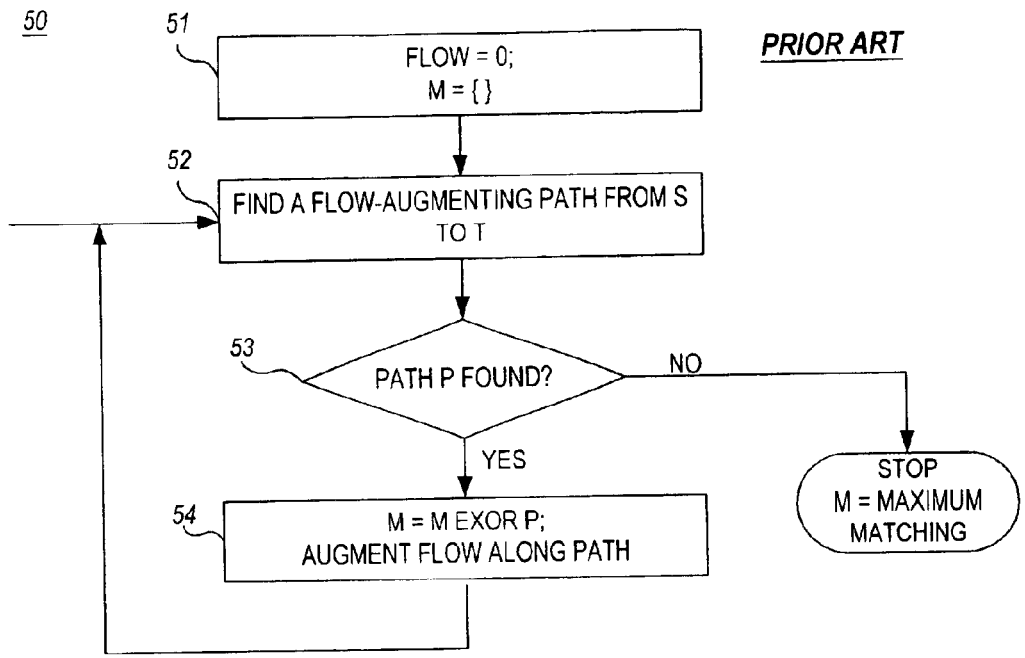
FIG. 4 is a flowchart illustrating a prior art Maximum Flow Algorithm for solving the Network Flow Problem.

FIG. 4 illustrates the classical approach to solving the Network Flow Problem. The technique, known as the Maximum Flow Algorithm 50, developed by L. R. Ford and D. R. Fulkerson, finds a maximum matching M that results in the maximum flow given a graph G=(V, E). As illustrated, in step 51, the matching M is initialized to an empty set and the flow F is initialized to 0. Then, in step 52, the algorithm 50 attempts to find a flow-augmenting path from S to T. If a flow-augmenting path P is found, as determined in step 53, then in step 54 the matching M is replaced by the Exclusive-OR function operated on M and P (M⊕P) and the flow is augmented. Steps 52–54 are then repeated until in step 53 the algorithm 50 discovers that a flow-augmenting path P from S to T does not exist. M then contains a maximum matching and F contains the maximum flow.

It is known that the Maximum Flow Algorithm of Ford-Fulkerson for solving the Network Flow Problem always produces not only a legal matching, but a maximum matching. When there are more than one maximum matchings, a cost is assigned to each one and the matching with the least cost is selected. The cost function is discussed later in section "II.d. Handling Solution Optimization" and in the context of two applications.

The probe-to-pin assignment problem may be only partially modeled as a Matching Problem due to the simplification of the test system network as in FIG. 3A. As a result, the Matching Problem approach provides only a partial matching solution. While this solution accounts for the Probes-Needed-Per-Node Constraint (Constraint 1), Resources-Required-Per-Node Constraint (Constraint 2), Pins-Available-To-Deliver-Resource Constraint (Constraint 4), and One-Pin-Per-Node Constraint (Constraint 6), it does not account for the Multiple-Resource-Per-Probe Constraint (Constraint 3) since the model allows only one resource delivered/measured per probe. In addition, the resulting solution does not account for either of the Same-Module Constraint (Constraint 5) or the Multiplexing Constraint (Constraint 7). Accordingly, while the Matching Problem concepts offer partial solutions to the pin-to-probe assignment problem, they are not complete.

II. Constraints and Optimization Solutions

Turning now in detail to the invention, the present invention utilizes the above-described Network Flow Problem technique to solve equivalent Matching problems of the Pin-to-Probe Assignment Problem, but includes additional techniques to account for all of the pin-to-probe assignment constraints (Constraints 1–7) in the test system network and to provide optimization of the pin-to-probe assignments (i.e., a maximum matching/flow with a minimum cost).

Figure 5:
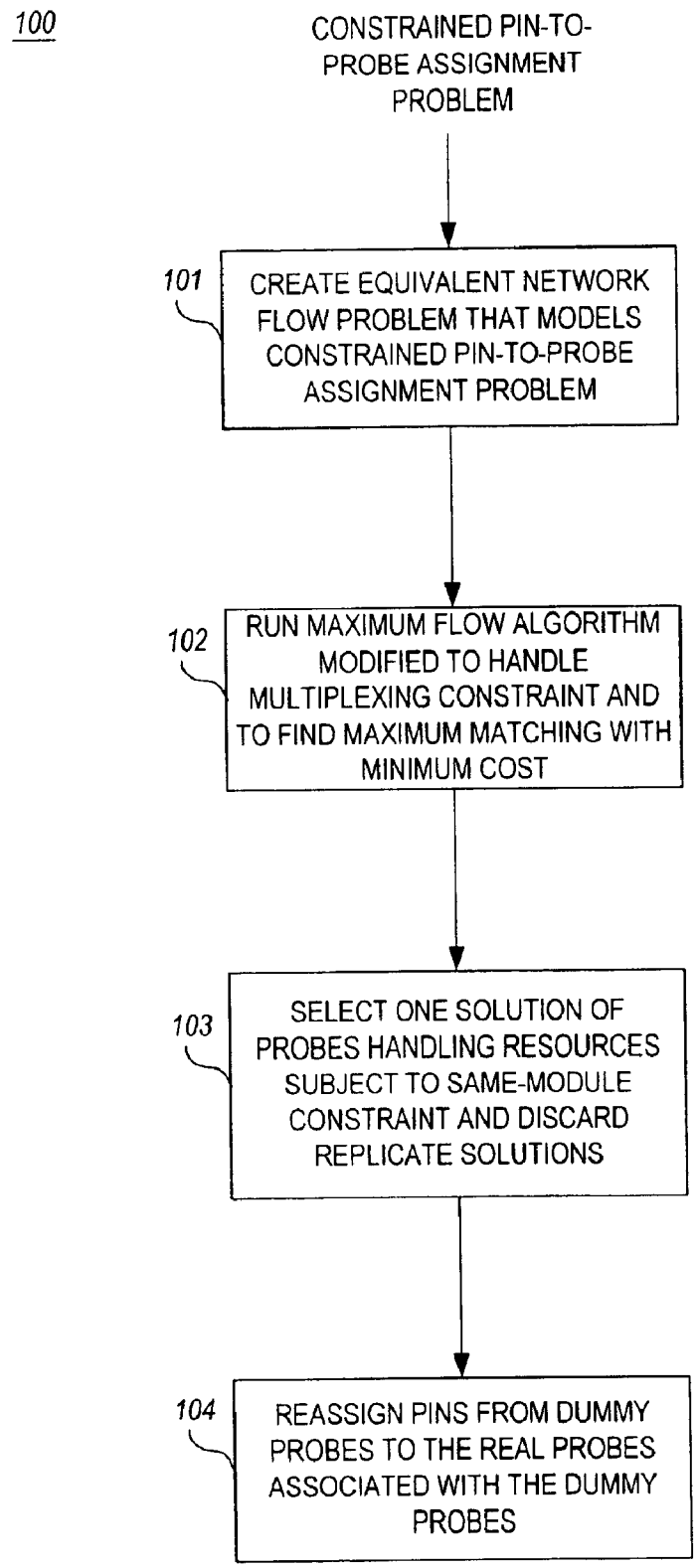
FIG. 5 is a flowchart illustrating the method of the invention for solving a constrained pin-to-probe assignment problem.

FIG. 5 is a flowchart illustrating the method 100 of the invention for solving a constrained pin-to-probe assignment problem. As illustrated, given a test system network including the nodes, probes, pins, resources, tests, the relationships therebetween, and the constraints such as multiplexed pins and tests that require resources to come from the same module, in step 101 the pin-to-probe assignment problem is modeled as an equivalent Network Flow Problem with modifications to account for all of the constraints (1–7). The modeling techniques to accomplish this step are described in detail hereinafter but may include creating replicate probes to create a 1-to-1 mapping of pins to probes for handling the Multiple-Resource-Per-Probe Constraint, creating replicate probes in each module for those probes required by each test subject to the Same-Module Constraint. Once an appropriate Network Flow Problem model of the test system network is developed, a Maximum Flow Algorithm modified to account for all constraints is applied in step 102 to the Network Flow Problem model to obtain an optimum matching.

Because the Maximum Flow Algorithm of the invention is applied to a Network Flow Problem that may include replicated probes to account for the Same-Module Constraint, one set of these constrained probes must be selected and their replicates removed from the solution, per step 103 of FIG. 5. Preferably, the replicated solution with the least cost is selected and the others removed from the final solution.

Finally, per step 104 in FIG. 5, the solution must be processed to reassign all pins assigned to dummy probes (due to the Multiple-Resource-Per-Probe Constraint) to the real probes associated with the dummy probes. The dummy probes must then be removed from the final solution.

Turning now in detail to the development of an equivalent Network Flow model that accounts for all test system network constraints (step 101 of FIG. 5), the following sections describe the modifications to the simplified Network Flow Problem and Maximum Flow Algorithm described above to achieve the requirements of the constrained pin-to-probe assignment problem.

a. Modifying the Test System Network Model to Handle the Multiple-Resource-Per-Probe Constraint The simplified Network Flow Problem model which allows only one resource per probe (e.g., as shown in FIGS. 3A–3C) is used as the initial basis for the equivalent Network Flow Problem of the constrained pin-to-probe assignment problem to be developed. As described previously in the discussion relating to FIGS. 3A–3C, a pin-to-probe assignment problem can be transformed into a bipartite graph only if each probe handles a single resource.

In order to handle the Multiple-Resource-Per-Probe Constraint (Constraint 3), the pin-to-probe assignment problem is modeled as a Matching Problem to represent the Probes-Needed-Per-Node Constraint (Constraint 1), the Resources-Required-Per-Node Constraint (Constraint 2), the Pins-Available-To-Deliver-Resource Constraint (Constraint 4), and the One-Pin-Per-Node Constraint (Constraint 6), as outlined above. To handle the Multiple-Resource-Per-Probe Constraint in which a probe can deliver/measure more than one of the resources used by the tests, a "dummy" probe is created for each additional resource to be handled by a given probe.

Figure 6A:
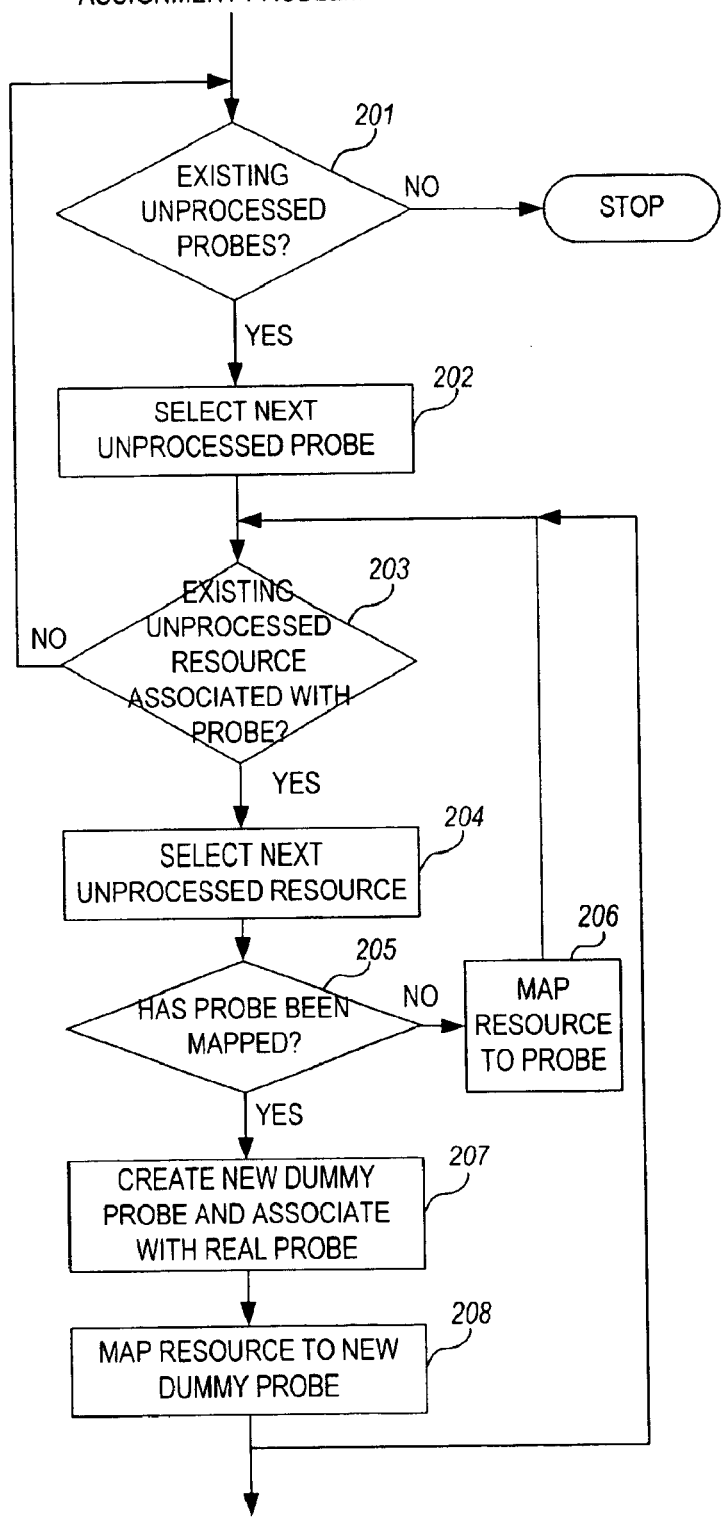
FIG. 6A is a flowchart illustrating an example method for modifying the test system network model for handling the Multiple-Resource-Per-Probe constraint.

FIG. 6A illustrates an example method 200 for handling the Multiple-Resource-Per-Probe constraint given a test system network. Method 200 includes a first step 201 of determining whether any unprocessed probes yet exist to be processed. The initial set of unprocessed probes includes each of the probes in the test system network. If any unprocessed probes exist, one of the remaining unprocessed probes is selected in a step 202. In a step 203, the method then finds all the resources associated with the selected probe and determines whether any unprocessed resources associated with the selected probe remain to be processed. If there exist unprocessed resources associated with the selected probe, one of the existing unprocessed resources associated with the selected probe is selected in a step 204. The method then determines whether the selected probe has already been mapped to another resource in a step 205. If the probe has not yet been mapped to the resource, the method maps the selected resource to the probe in a step 206. If the probe has previously been mapped to another resource, the method creates a new dummy instance of the selected probe and associates it with the selected probe in a step 207. In a step 208, the selected resource is then mapped to the new dummy probe. Steps 203 through 208 are repeated as needed a number of iterations equal to the number of resources that the selected probe is expected to handle.

It will be appreciated that as each probe gets processed, the first resource processed by the method 200 will always be mapped to the real probe being processed. If the probe handles multiple resources, then the number of dummy probes that get created and associated with a given probe equals the number of resources that the probe is expected to handle less one (which is mapped to the "real" probe). The resulting mapping of probes ("real" and "fictitious") is thus a one-to-one mapping.

Steps 201 through 208 are repeated as needed a number of iterations equal to the number of probes in the input list.

Figure 6B:
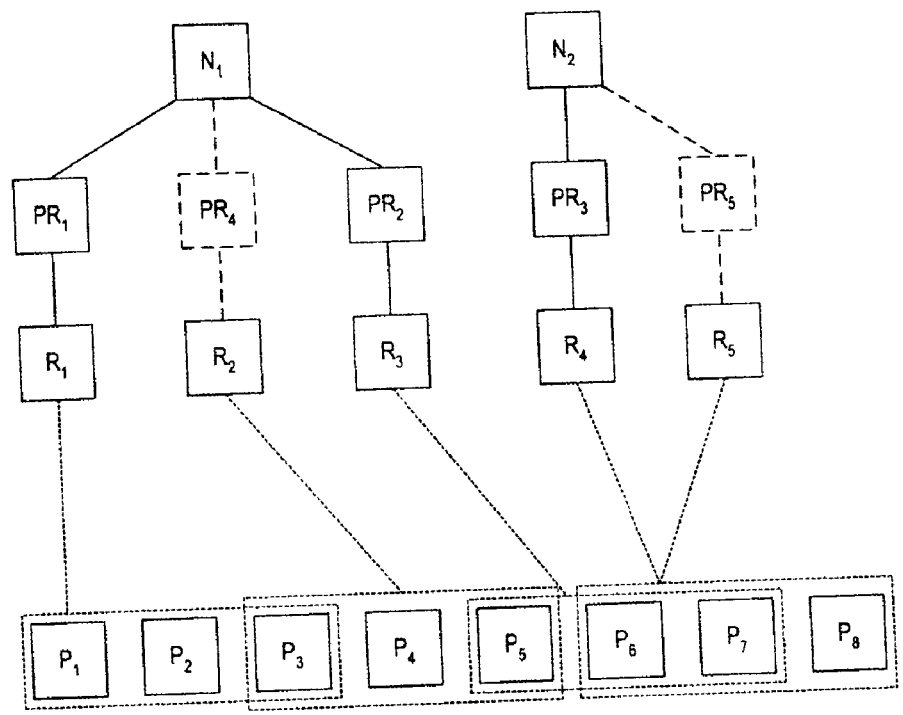
FIG. 6B is an equivalent Matching Problem model of the modified test system network model of FIG. 1A.
Figure 6C:
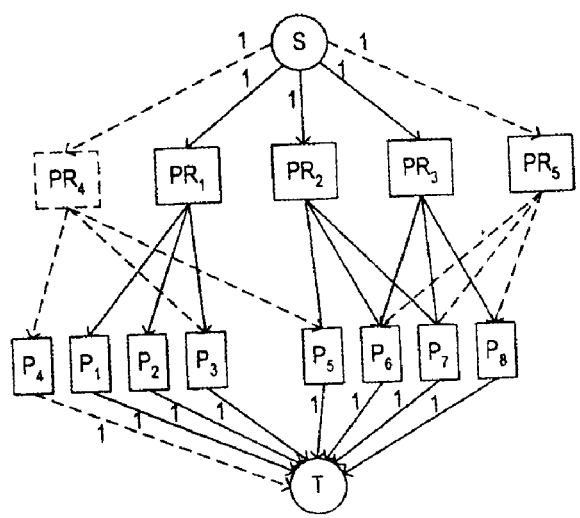
FIG. 6C is an equivalent Network Flow Problem model of the modified test system network model of FIG. 6B.

Execution of steps 201 through 208 of the method of FIG. 6A applied to the example test system network of FIG. 1 will therefore result in the modified test system network shown in FIG. 6B. Because each resource is mapped to a single probe in this network (either to a "real" or a "dummy" probe, indicated in FIG. 6B by dashed lines for dummy probes), the modified test system network may then be modeled as a Matching Problem and as the simplified Network Flow Problem, as shown in FIG. 6C.

b. Modifying the Test System Network Model to Handle the Same-Module Constraint

Large testers often partition resources and tester pins across multiple modules. Many analog tests which require higher current sensitivity require that their resources be constrained to use pins belonging to the same module. This constraint is handled by replicating in the model the probes that handle the resource across each module that provides the resource.

Figure 7A:
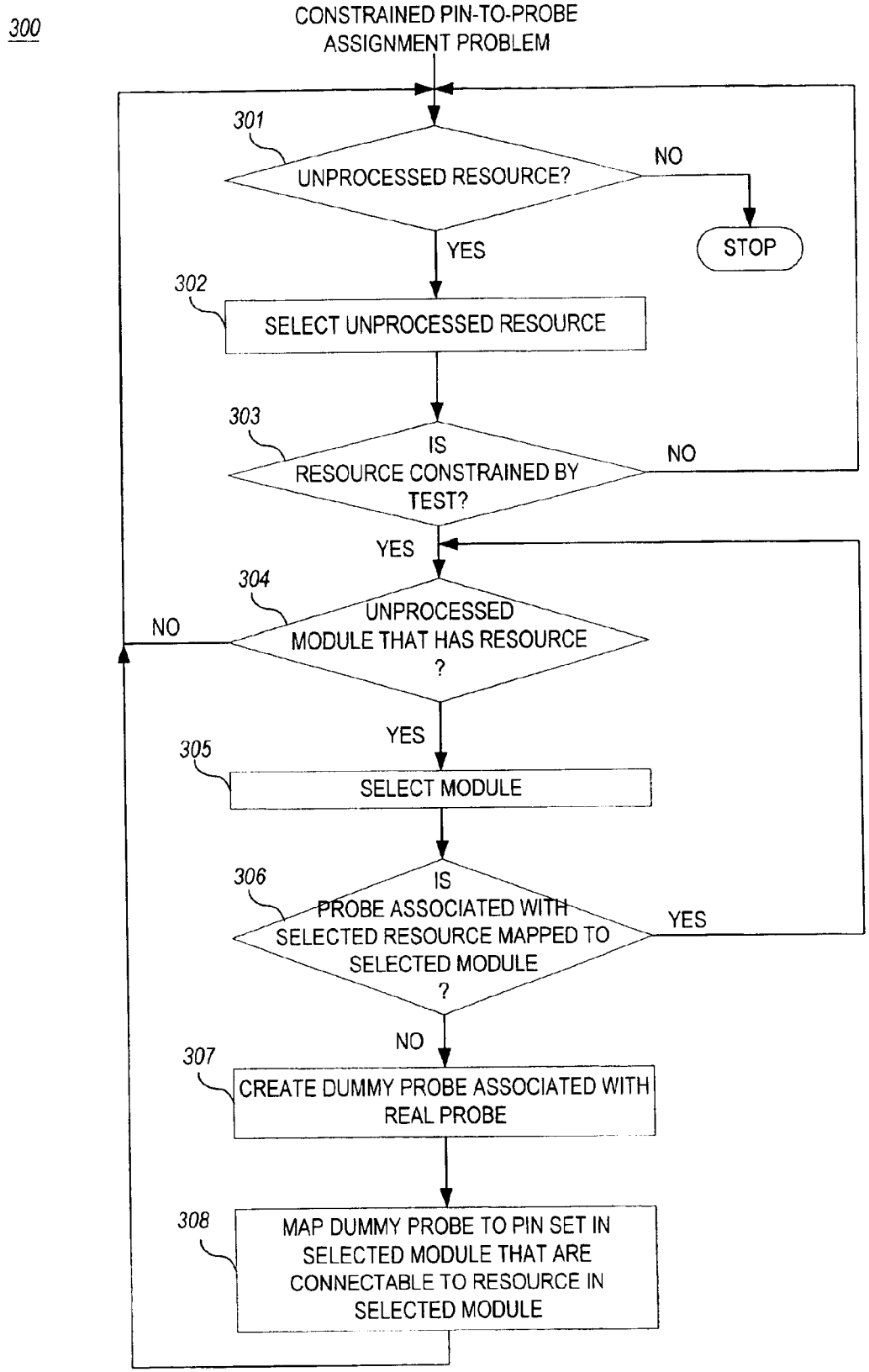
FIG. 7A is a flowchart illustrating a method for modifying the test system network of FIG. 6A to account for the Same-Module Constraint.

In particular, FIG. 7A shows a flowchart illustrating a method for modifying the test system network to allow conversion of the network into an equivalent Network Flow Problem that accounts for the Same-Module Constraint. As illustrated in FIG. 7A, the method 300 takes as input the test system network, preferably previously modified if necessary to handle the Multiple-Resource-Per-Probe Constraint (e.g., according to method 200 in FIG. 6A). The method operates generally to process each resource, determine whether the resource is used by a constrained test, and for each resource used by a constrained test, duplicates the probes that handle the resource with dummy probes over each module that provides the resource under consideration.

In greater detail, the method 300 determines in a step 301 whether any resources in the test system network have yet to be processed by the algorithm. If so, the algorithm selects an unprocessed resource in a step 302. The algorithm then checks whether the selected resource is used by a constrained test in a step 303. If the resource is not used by a constrained test, steps 301–303 are repeated until either all resources are processed or until a resource is found that is used by a constrained test.

When such a resource is found, the algorithm steps through the available modules. To this end, the algorithm determines in a step 304 whether a module having the selected resource exists that has not yet been processed by the algorithm. If so, a module that provides the resource capability is selected in a step 305. The algorithm then determines in a step 306 whether the probe in the test system network that is associated with the resource is mapped to the selected module. If so, the probe already exists in the test system network, so the algorithm moves on to the next unprocessed module by repeating steps 304–306. On the second iteration, the algorithm will discover that the probe associated with the selected resource is mapped to a different module (per the previous iteration), and therefore the probe associated with the resource cannot be mapped to the selected module. Accordingly, in a step 307, the algorithm creates a new "dummy" probe that operates as a separate vertex in the Network Flow model but which is associated with the "real" probe (for later selection of a single solution). In a step 308, the algorithm maps the dummy probe to pins of a pin set in the selected module that can connect to the selected resource in the selected module. Steps 304–308 are repeated as needed until all available modules that provide the selected resource are processed.

It should be noted that the Same-Module Constraint requires probes to connect only to pins in a single module. For another module, the probes must be "dummied" and their dummies connected to pins in the new module. Without the constraints, the probes do not need to be dummied to connect to other module.

Figure 7B:
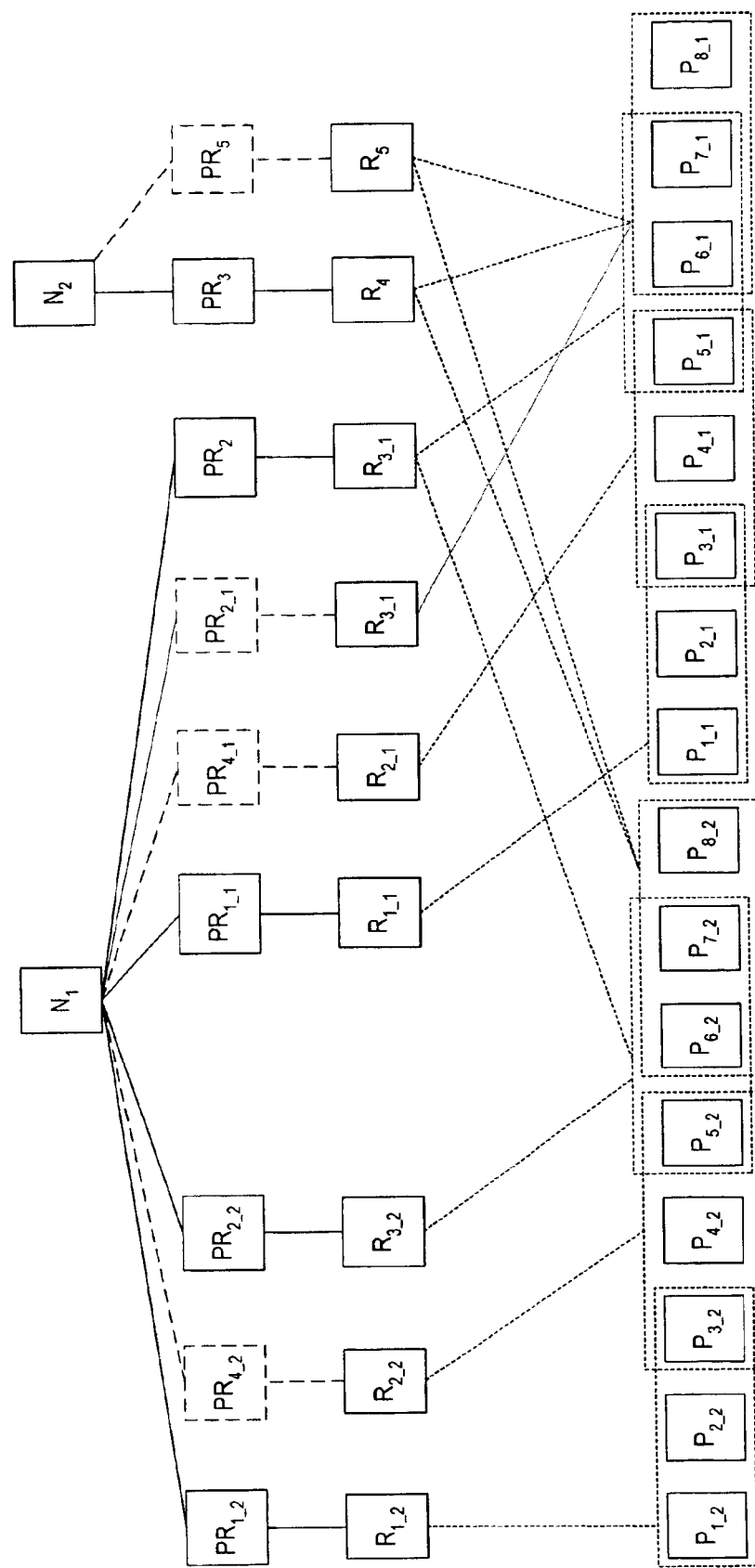
FIG. 7B is an equivalent Matching Problem model of the modified test system network model of FIG. 6B to account for the Same-Module Constraint.
Figure 7C:
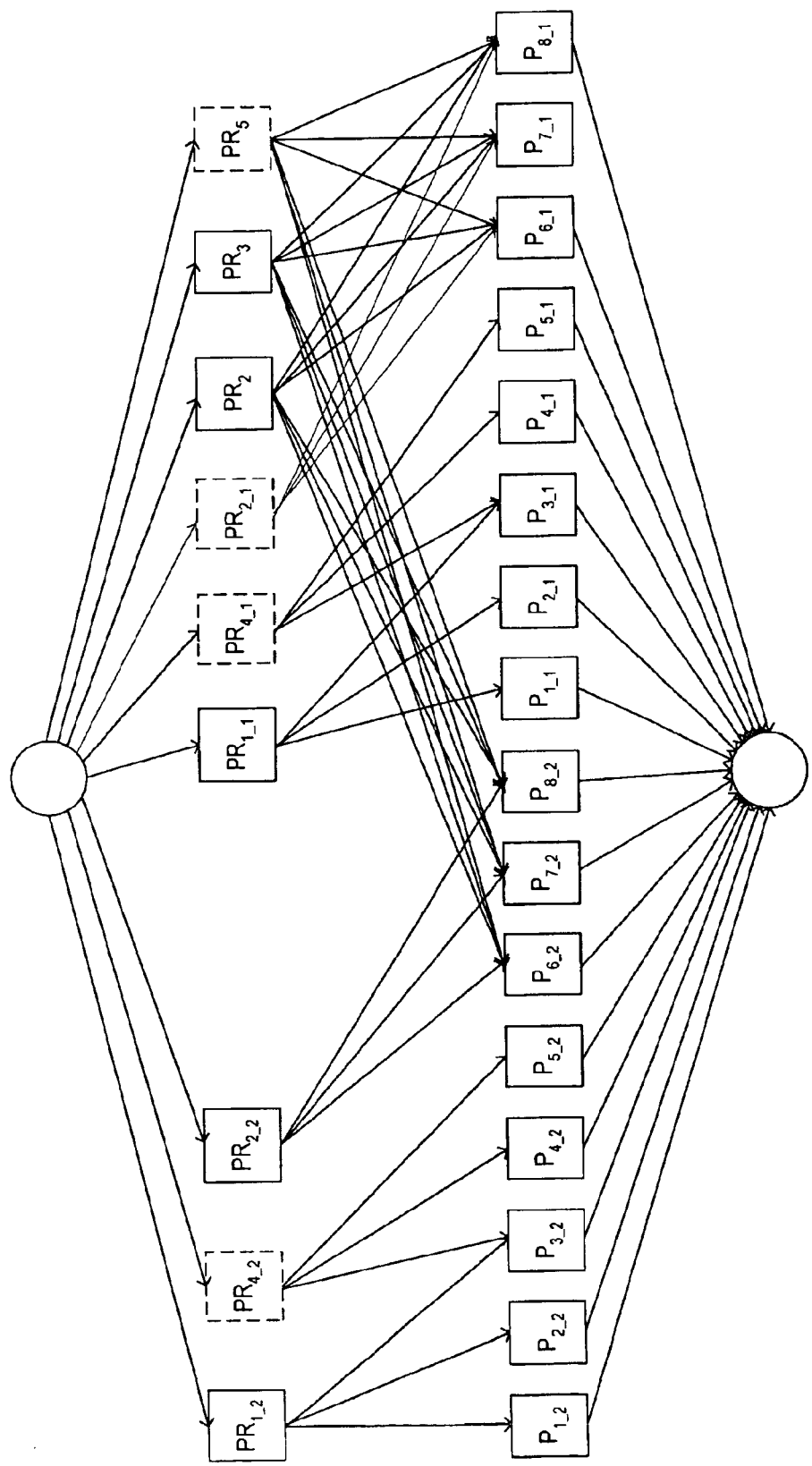
FIG. 7C is an equivalent Network Flow Problem model of the modified test system network model of FIG. 7B.

Application of the algorithm 300 of FIG. 7A to the modified test system network of FIG. 1 results in the modified test system network shown in FIG. 7B under the assumptions that (1) the test $T_1$ (which accesses resources $R_1$, $R_2$, and $R_3$ via probes $PR_1$ and $PR_2$ (see FIG. 1)) must satisfy the Same-Module Constraint, (2) the tester comprises two modules $MOD_1$ and $MOD_2$ that each provide like resources $R_1$, $R_2$, and $R_3$, and (3) the Multiple-Resource-Per-Probe Constraint must also be satisfied (and thus dummy probes per FIG. 6B are included). As illustrated therein, the tester pins include one set $\{P_{1\_1}, P_{2\_1}, P_{3\_1}, P_{4\_1}, P_{5\_1}, P_{6\_1}, P_{7\_1}, P_{8\_1}\}$ from the first module $MOD_1$, and a second set $\{P_{1\_2}, P_{2\_2}, P_{3\_2}, P_{4\_2}, P_{5\_2}, P_{6\_2}, P_{7\_2}, P_{8\_2}\}$ from the second module $MOD_2$. Each module $MOD_1$ and $MOD_2$ provides like resources $R_1$, $R_2$, and $R_3$, shown respectively as $R_{1\_1}$, $R_{2\_1}$, and $R_{3\_1}$ in $MOD_1$, and $R_{1\_2}$, $R_{2\_2}$, and $R_{3\_2}$ in $MOD_2$. In this example, since the resources $R_1$, $R_2$, and $R_3$ in FIGS. 1 and 6B are handled by probes $PR_1$ and $PR_2$, probes $PR_1$ and $PR_2$ (shown in FIG. 7B as probes $PR_{1\_1}$ and $PR_{2\_1}$ in $MOD_1$) are replicated by creating dummy probes $PR_{1\_2}$ and $PR_{2\_2}$ in $MOD_2$. In addition, because in this example the Multiple-Resource-Per-Probe Constraint must be also be satisfied, the dummy probe $PR_4$ (created as per FIG. 6B) that is shown in FIG. 7B as probe $PR_{4\_1}$, must also be replicated by creating a dummy probe $PR_{4\_2}$ in $MOD_2$. The equivalent Network Flow Problem for the network model of FIG. 7B is shown in FIG. 7C.

As a note of further observation, and referring once again to FIG. 1 in which an original assumption was that test T1 uses resources R1, R2, and R3 and test T2 uses resources R3, R4, and R5, it is to be noted that since it was assumed for the Same-Module Constraint example that T1 has the same-module constraint (and not T2), the probes used for T2 do not need to be dummied to connect to other modules. One of these probes is PR2, which is also used for test T1. Accordingly, in order to model the network correctly, PR2 has a link (edge) to pins in each module to take care of test T2 needs. Then to take care of test T1 needs, in this example we found that PR2 was already used and accordingly an associated dummy probe is created for it in each module. As a result, FIG. 7B and FIG. 7C show PR2 connected to both module 1 and module 2, and $PR_{2\_1}$ connected only to module 1. Note resource R3 is duplicated in FIGS. 7B and 7C, but these nodes are not used (only probes and pins nodes are considered in the flow network).

c. Modifying the Maximum Flow Algorithm to Handle the Multiplexing Constraint

Prior art solution techniques for solving the Network Flow Problem do not handle the Multiplexing Constraint wherein the test system includes one or more sets $\{M_i\}$ of disjoint pin groupings each comprising pins that are multiplexed together and that cannot be used simultaneously in the same test. In graph theory terminology, the Multiplexing Constraint applied to a bipartite graph comprising a first set $V_1$ of vertices (e.g., probes) and a disjoint second set $V_2$ of vertices (e.g., pins) implies that an edge cannot be selected if the edge terminates in a vertex $w_1$ from the second set $V_2$ that is multiplexed to a vertex $w_2$ in $V_2$ that has already been assigned to a probe.

Figure 8:
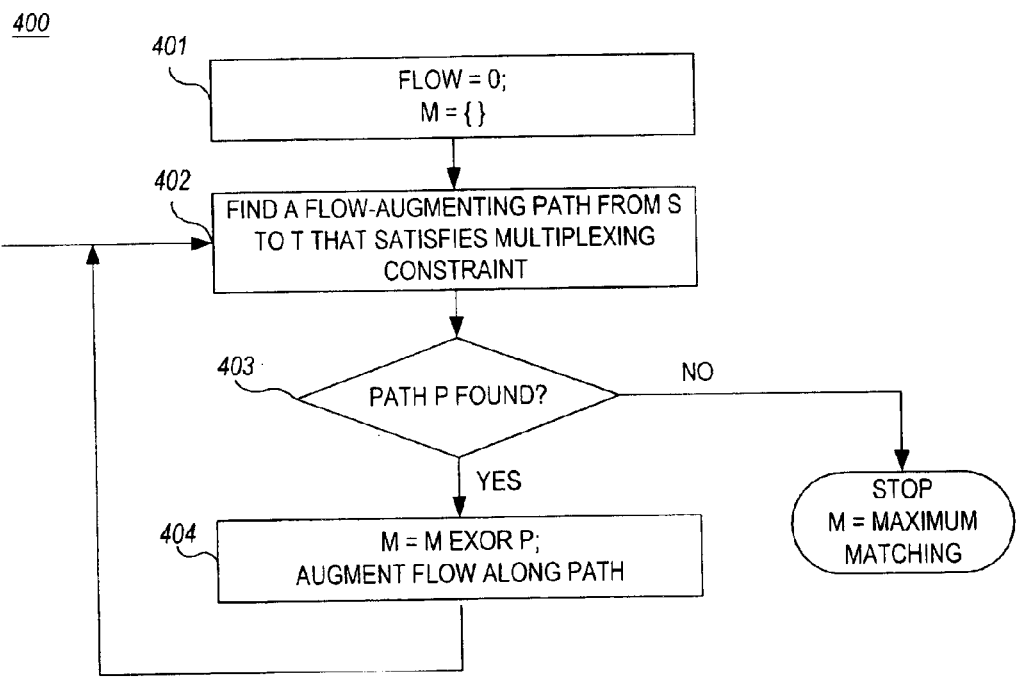
FIG. 8 is a modified Maximum Flow Algorithm that accounts for the Multiplexing Constraint.

To handle the Multiplexing Constraint (Constraint 7), the present invention adapts the Maximum Flow Algorithm (step 102 of FIG. 5) to verify that each flow-augmenting path satisfies the Multiplexing Constraint. FIG. 8 illustrates a modified Maximum Flow Algorithm 400 that accounts for the Multiplexing Constraint. This algorithm 400 begins with a step 401 in which the matching M is initialized to an empty set and the flow F is initialized to 0. Then, in step 402, the algorithm attempts to find a flow-augmenting path P from S to T that satisfies the Multiplexing Constraint. If a flow-augmenting path P is found, as determined in step 403, then in step 404 the matching M is replaced by M⊕P and the flow along the path P is augmented. Steps 402–404 are then repeated until in step 402 the algorithm discovers that a flow-augmenting path P from S to T does not exist. M then contains a maximum matching that satisfies the Multiplexing Constraint, and FLOW contains the maximum flow.

Typically, the flow-augmenting path is found by searching for the "best" path between the source vertex S to the sink vertex T on the directed graph. To quantify "best," a cost is assigned to the edges connecting probe vertices (v in $V_1$) to pin vertices (w in $V_2$) such that cost=capacity−flow, where capacity is set to 1 and flow is the actual flow through the edge, which is set during each iteration of the algorithm.

In the preferred embodiment, the method for finding a flow-augmenting path from S to T that satisfies the Multiplexing Constraint is implemented using a modified version of what is known as "The Minimum-Cost Algorithm". The Minimum-Cost Algorithm is a method for efficiently solving what is known as the "Single-Source Shortest Path Problem" and may be adapted and utilized with certain modifications to efficiently find a flow-augmenting path from the source vertex S to the sink vertex T in a Network Flow Problem model.

Figure 9:
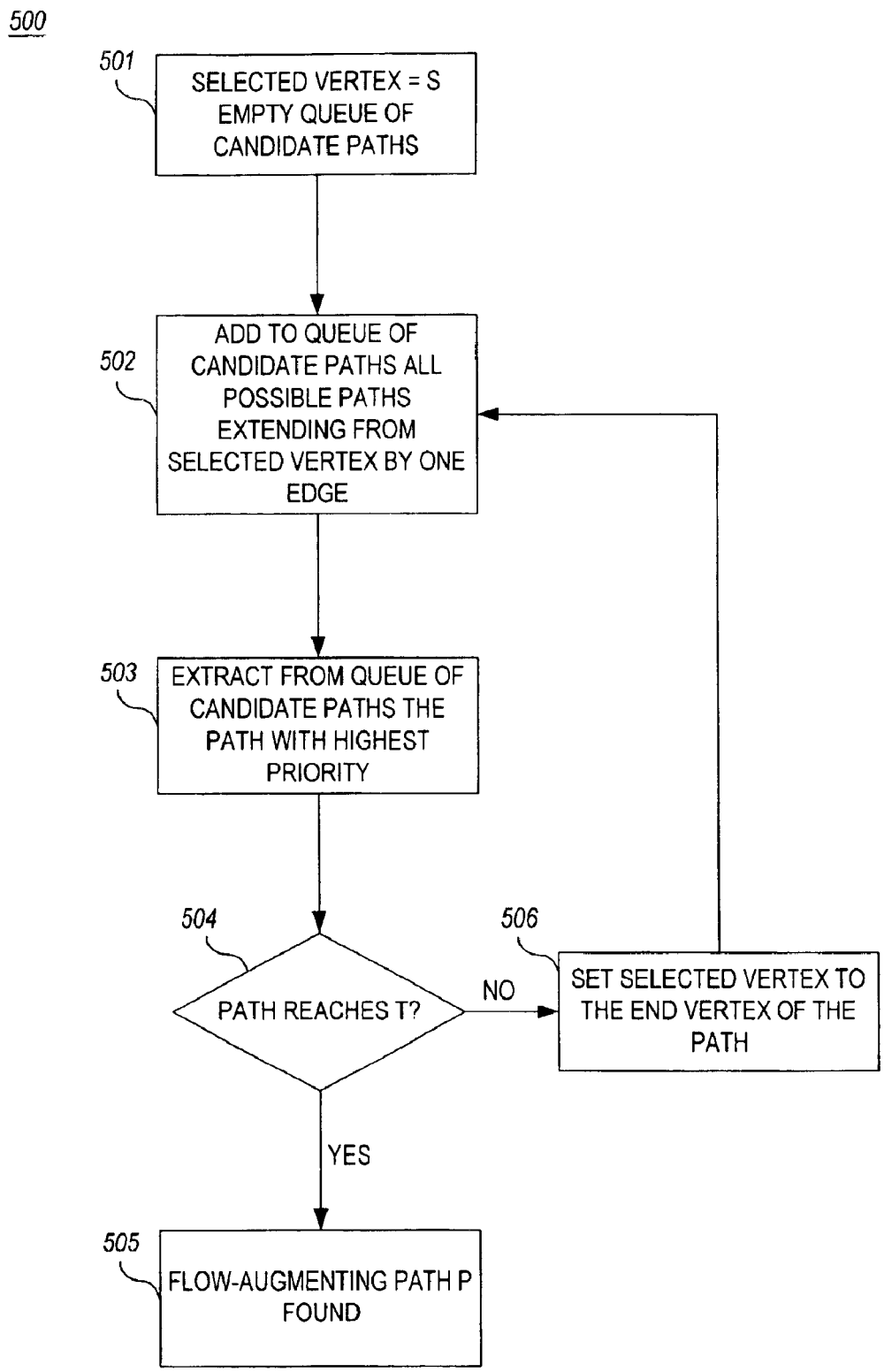
FIG. 9 is a flowchart of a modified Minimum-Cost Algorithm for finding a flow-augmenting path from S to T that satisfies the Multiplexing Constraint.

FIG. 9 is a flowchart of an example of the modified Minimum-Cost Algorithm 500 for finding a flow-augmenting path from S to T that satisfies the Multiplexing Constraint. As illustrated, the algorithm 500 begins in step 501 by setting the selected vertex to be S. A queue of candidate paths from S to T is initialized to empty. Then the algorithm checks all the edges that are incident to the selected vertex. A "cost value" for each edge is calculated as the capacity of the edge minus the flow through the edge. It should be recalled that in a Network Flow problem each edge has a "capacity", which is equivalent to the maximum flow that the edge can sustain. At the start of the Maximum Flow algorithm, all edges have zero flow and their capacity is set to 1.

To account for the orientation of the edges, the cost value is instead set to minus the flow through the edge if the edge is not directed away from the selected vertex. With the "cost value" of all edges set as described, the algorithm keeps track of the sum of the cost values of the edges it follows from S as it progresses towards T. Each edge that is incident on the selected vertex extends the current path from S and adds its cost value to the total value of the path followed so far. In step 502 the algorithm places in the priority queue all the new possible paths to follow. In step 503 it selects the path with the highest priority (i.e. lowest cost) and sets the vertex reached via this path as the new selected vertex. This process is then repeated until the selected path is found to reach T, as illustrated in steps 505 and 506. This final path is the flow-augmenting path P.

Figure 10A:
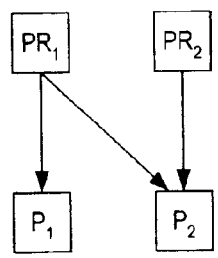
FIG. 10A is a simplified network diagram of a matching problem used to illustrate the Maximum Flow Algorithm.
Figure 10B:
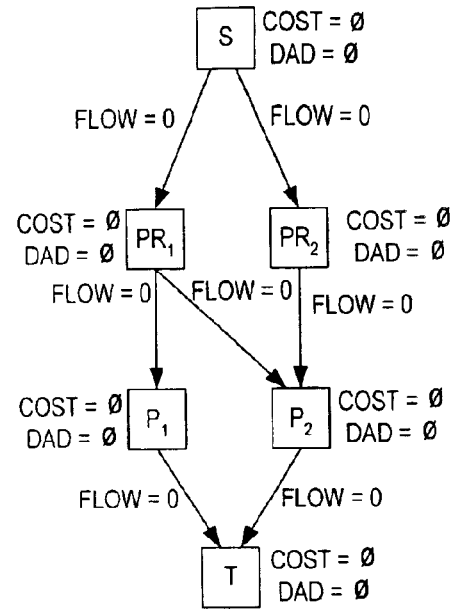
FIG. 10B is a Network Flow Problem equivalent of the matching problem of FIG. 10A at initialization of the Maximum Flow Algorithm.

For illustration, FIGS. 10B through 10G illustrate the different steps of the Maximum Network Flow algorithm in the context of the simple example of the Network Flow problem of FIG. 10A (same as in FIG. 2A). In this example, FIG. 10A shows that probes PR1 can be assigned either to pin P1 or to pin P2, whereas probe PR2 can be assigned only to pin P2.

To illustrate the operation of the Modified Network Flow Algorithm 500, FIGS. 10B through 10G uses the following nomenclature: The flow of an edge is a variable which indicates the value of the flow through the edge. In the present example, the FLOW can have a value of either "1", indicating that the path flows through the edge, or "0", indicating that the path does not flow through the edge. The COST of a vertex is a variable which indicates either that the vertex has not been visited (indicated by the symbol "Ø") or the actual value of the cost of the path from S to that vertex (indicated by a number). The DAD of a vertex is a variable which indicates either that the vertex has not been visited (indicated by the symbol "Ø") or the name of the parent vertex from which the vertex was reached to result in the corresponding value of COST. The DAD variables are used at the completion of the algorithm 500 to retrieve the path P from S to T. In particular, the value of DAD of vertex T gives the parent of T in the path P (e.g., "P1"); then the value of DAD of vertex P1 gives the parent of vertex P in the path P (e.g., "PR1"); then the value of DAD of vertex PR1 gives the parent of vertex PR1 in the path P (e.g., "S") to complete the path P.

Returning to FIGS. 10A through 10G, when the Modified Minimum Cost Algorithm 500 begins, the FLOW of each edge is initialized to "0", and the DAD and COST values of each vertex are each initialized to "Ø", as illustrated in FIG. 10B.

The algorithm next invokes the Minimum-Cost Algorithm to find a flow-augmenting path as described earlier. Starting with S, the Minimum-Cost Algorithm retrieves all vertices $V_x$ incident to S. The cost C of the edge to reach each vertex $V_x$ is calculated as described before: capacity-flow, or—flow if the edge to the vertex is followed in the wrong direction. This cost is then used to determine the new COST value of each vertex $V_x$ as follows: if COST for a vertex $V_x$ has the value "Ø", then COST for that vertex $V_x$ is updated to be the calculated cost value C+the value of COST for the DAD of that vertex $V_x$ (if the DATA of that vertex $V_x$ is not "Ø", otherwise just C) and the value of DAD of that vertex $V_x$ is updated to the name of vertex on the other end of the edge followed to reach the particular vertex $V_x$. Otherwise, if the vertex $V_x$ has previously been visited (i.e., COST is not "Ø"), the COST value of the vertex $V_y$ on the other end of the edge just followed is examined. If the COST of vertex $V_y$+the calculated cost C is less than the current value of COST for vertex $V_{x1}$ the DAD for vertex $V_x$ is updated to be "$V_y$" and COST for vertex $V_x$ is updated to be COST of vertex $V_y$+the calculated cost C.

Figure 10C:
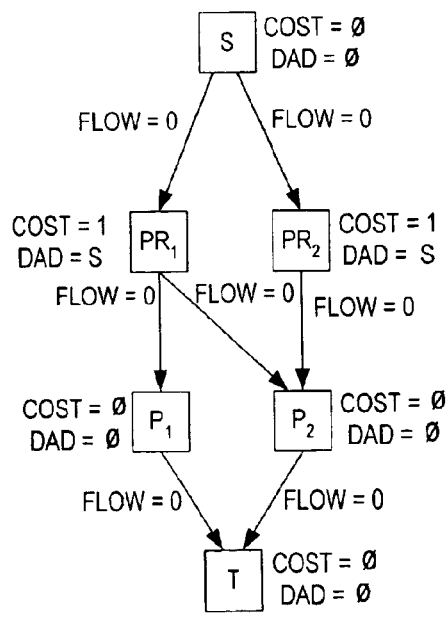
FIG. 10C is the state of the Network Flow Problem of FIG. 10B after one step of the Maximum Flow Algorithm.
Figure 10D:
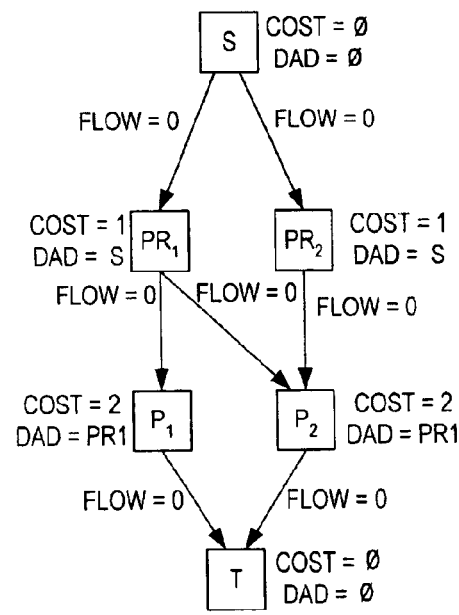
FIG. 10D is the state of the Network Flow Problem of FIG. 10B and 10C after two steps of the Maximum Flow Algorithm.

In our example, the COST for each vertex is initialized to "Ø"; hence the new COST for the vertices PR1 and PR2 incident on S is the calculated cost C for the edge leading to the vertex PR1, PR2 (which is 1−0=1), and the value of DAD for each of these vertices PR1, PR2 becomes S. This is illustrated in FIG. 10C. Next, the vertex with the highest priority, i.e. the lowest positive value COST, is selected, in the illustrative example vertex PR1 (arbitrarily breaking the tie with vertex PR2). Similarly, the vertices adjacent to PR1 and not visited are P1 and P2. Since the FLOW is zero, the cost calculated for each vertex P1, P2 is 1 and the DAD and COST values are updated by using the same procedure as above. FIG. 10D shows the resulting state of the flow network.

Figure 10E:
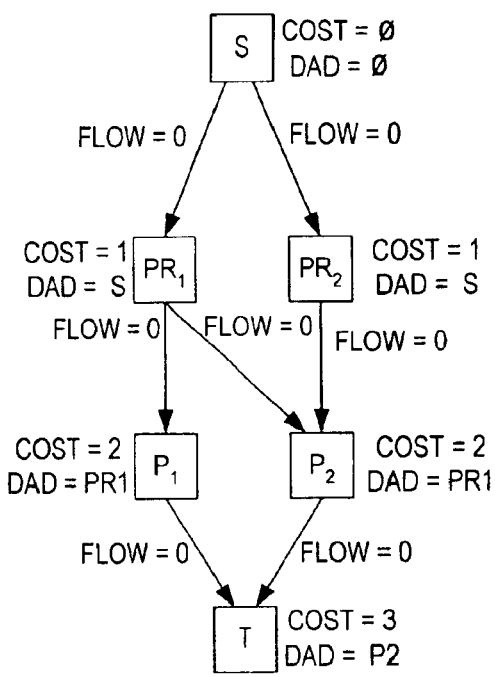
FIG. 10E is the state of the network of FIGS. 10B–10D after termination of one iteration of the Maximum Flow Algorithm.

Next, vertex PR2 is selected because its COST value represents the highest priority (shortest path or minimum cost). The incident vertices that are not visited are vertex P2. By calculating the new cost to reach this node as COST of PR2+cost C of edge (1+1=2), and comparing it with the COST value (2) that vertex P2 already has, we find the two values to be equal, and therefore we ignore this path since it does not result in a better path to P2. Next, the algorithm 500 selects the vertex with the least COST value, or vertex P2 (arbitrarily breaking tie with vertex P1). The only incident, unvisited vertex is vertex T. We repeat the procedure to calculate COST and DAD for T as with the other nodes. FIG. 10E shows the final result. The search can continue by expanding vertex P1, but ultimately the Minimum-Cost algorithm terminates with the minimum path to T as described by the DAD values: T, P2, PR1, S.

Figure 10F:
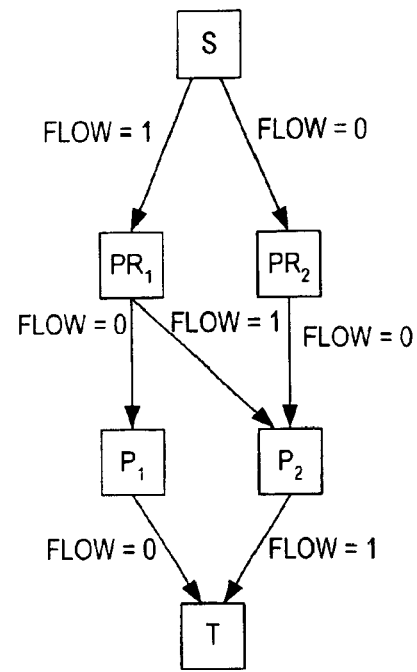
FIG. 10F is the state of the network of FIGS. 10B–10E after the Maximum Flow algorithm increases the total flow FLOW with the flow along this flow-augmenting path.

Given the flow-augmenting path P=T–P2–PR1–S, the Maximum Flow algorithm increases the FLOW along this path P by its maximum value of 1. The new Network Flow problem is as shown in FIG. 10F. The Maximum Flow algorithm proceeds with its second iteration by invoking the Minimum Cost Algorithm as above, except that now the flow on some edges is not zero, and therefore, the calculated costs used to determine the priority to select vertices will result in a different path between S and T.

Figure 10G:
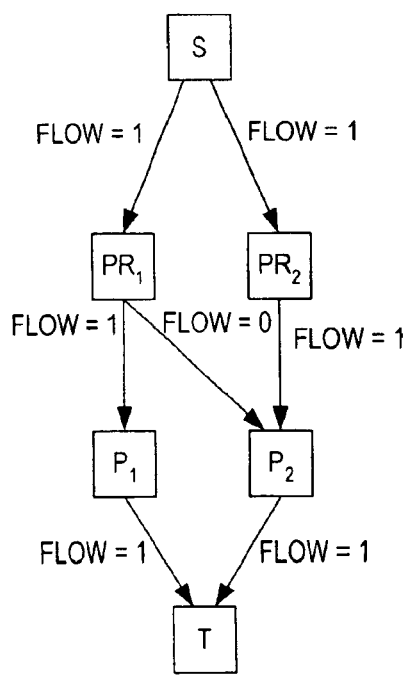
FIG. 10G is the state of the network of FIGS. 10B–10F after the Maximum Flow Algorithm completes.

The above process continues until the Minimum Cost Algorithm does not find a path reaching T (i.e. there are no flow-augmenting paths). It can be easily verified that this condition happens when the Flow Network is as shown in FIG. 10G.

In the algorithm of FIG. 9, a candidate probe-pin link is selected only if one of the following 2 conditions is satisfied:

(1) The pin has not been assigned to any probe and it is not multiplexed to any of the previously assigned pins used in the same test; or (2) The pin has been assigned to some probe in a previous iteration.

This probe-pin link is considered because it may result in "re-assigning" the pin to obtain a better flow. Before re-assigning, however, one must first verify that the new assignment does not violate the Multiplexing Constraint.

Checking if a pin has been assigned to a probe is easily done if saved with each pin is the probe it is assigned to. In order to check the multiplexing condition for a given pin $P_i$, the algorithm loops through the set $M_i$ of pins that are multiplexed to $P_i$ and checks if any pin is assigned to a probe used in the same test as the currently considered probe.

If none of the above two conditions is satisfied, the algorithm skips the candidate probe-pin link for a possible later consideration. This condition is incorporated in step 502 of FIG. 9.

Because the Maximum Flow Algorithm of the invention is applied to a Network Flow Problem that includes replicated probes to account for the Same-Module Constraint, one set of these constrained probes must be selected and their replicates removed from the solution (per step 103 of FIG. 5). Preferably, the replicated solution with the least cost is selected and the others removed from the final solution.

Finally, (per step 104 in FIG. 5) the solution must the processed to reassign all pins assigned to dummy probes (due to the Multiple-Resource Constraint) to the real probes associated with the dummy probes. The dummy probes must then be removed from the final solution.

d. Handling Solution Optimization

Figure 11:
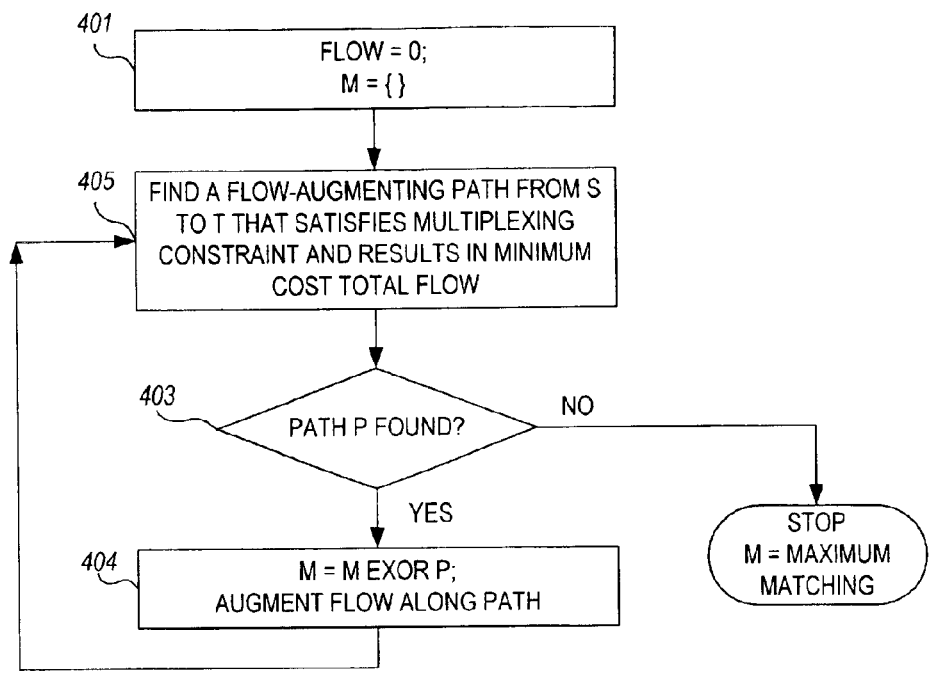
FIG. 11 is a flowchart illustrating an optimizing Maximum Flow Algorithm that handles the pin-to-probe assignment problem and obtains a maximum assignment with a minimized cost.

Finally, the maximum-flow solution that has a minimum cost is obtained by modifying the Maximum Flow Algorithm to also keep track of the cost associated with each flow solution as the search for the maximum-flow solution proceeds. When a flow-improving path is found (in step 402 of FIG. 8) or if a path that maintains the flow unchanged is found, additional steps may be added to ensure that if there two such paths are found, the algorithm selects the path with the smaller cost. FIG. 11 illustrates a Maximum Flow Algorithm 600 that accounts for the stated constraints and obtains a maximum assignment with a minimized cost. As illustrated, the algorithm is similar to the Maximum Flow Algorithm of FIG. 8, but step 402 of FIG. 8 is replaced with step 405 in FIG. 10 in which the algorithm finds a flow-augmenting path from S to T that satisfies the Multiplexing Constraint and results in minimum cost total flow.

III. Applications

Following are two applications of the invention. It should be understood, however, that the invention may be used in many other applications by appropriately re-working the constraints and the optimization criterion to fit each specific application.

a. Layer Reduction in PCBs of Wireless Fixtures

Printed-circuit boards (PCBs) are made of several layers. Their cost and manufacturing time increase with the number of layers and, therefore, it is desirable to minimize this number. In wireless fixtures (See for example, U.S. patent application Ser. No. 10/192,142, filed Jul. 10, 2002, entitled "*Method And Apparatus For Determining Proper Trace Widths For Printed Circuit Board of Wireless Test Fixture*" to the same inventor, and incorporated herein for all that it teaches) there is a PCB whose top side has pads contacted by probes of the fixture, and whose bottom side has pads contacted by pins of the tester. Once the top pads of the PCB are assigned to bottom pads, non-intersecting traces are routed between corresponding pads throughout the inner layers of the PCB.

Layers fill up with traces. Roughly speaking, the thicker the traces, the fewer can fit in a fixed-size layer area. On the other hand a trace is defined as conductive material connecting a given top (probe) pad to the bottom (pin) pad assigned to it. The trace width is determined by the length of the trace and the electrical requirement of the resource to be delivered from pin to probe.

Since trace length affects its width, it is clear that the pin assigned to a probe (which affects the length between them) will affect the width of the trace between them and, therefore, the number of traces that can fit in a layer, and ultimately the total number of layers required to fit all traces. Trace width is readily calculated as a function of its length and the maximum impedance allowed (See U.S. patent application Ser. No. 10/192,142, supra, for example formulae).

Figure 12:
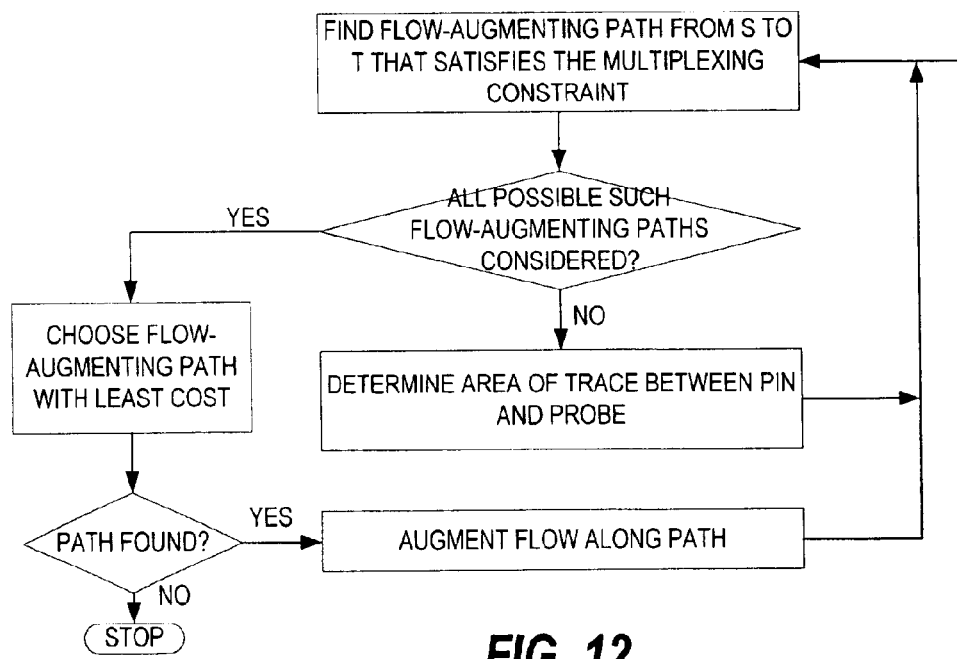
FIG. 12 is a flowchart of an optimizing Maximum Flow Algorithm for finding a pin assignment that minimizes the number of layers in a printed circuit board by seeking a solution that minimizes the total area occupied by the traces in the printed circuit board.

Based on the above consideration, in order to find a pin assignment that minimizes the number of layers, the solution seeks a pin-to-probe assignment that minimizes the total area occupied by the traces. In this problem, we define a cost as the area occupied by the traces routed in a Manhattan way between its probe pad and pin pad. Hence, at each iteration of the Maximum Flow Algorithm of FIG. 11, if a new flow-augmenting path is found not to improve the flow, but the overall area of the traces is improved, that path is selected. FIG. 12 shows a flowchart of this algorithm.

b. Cards Reduction in Conventional Testers

Figure 13A:
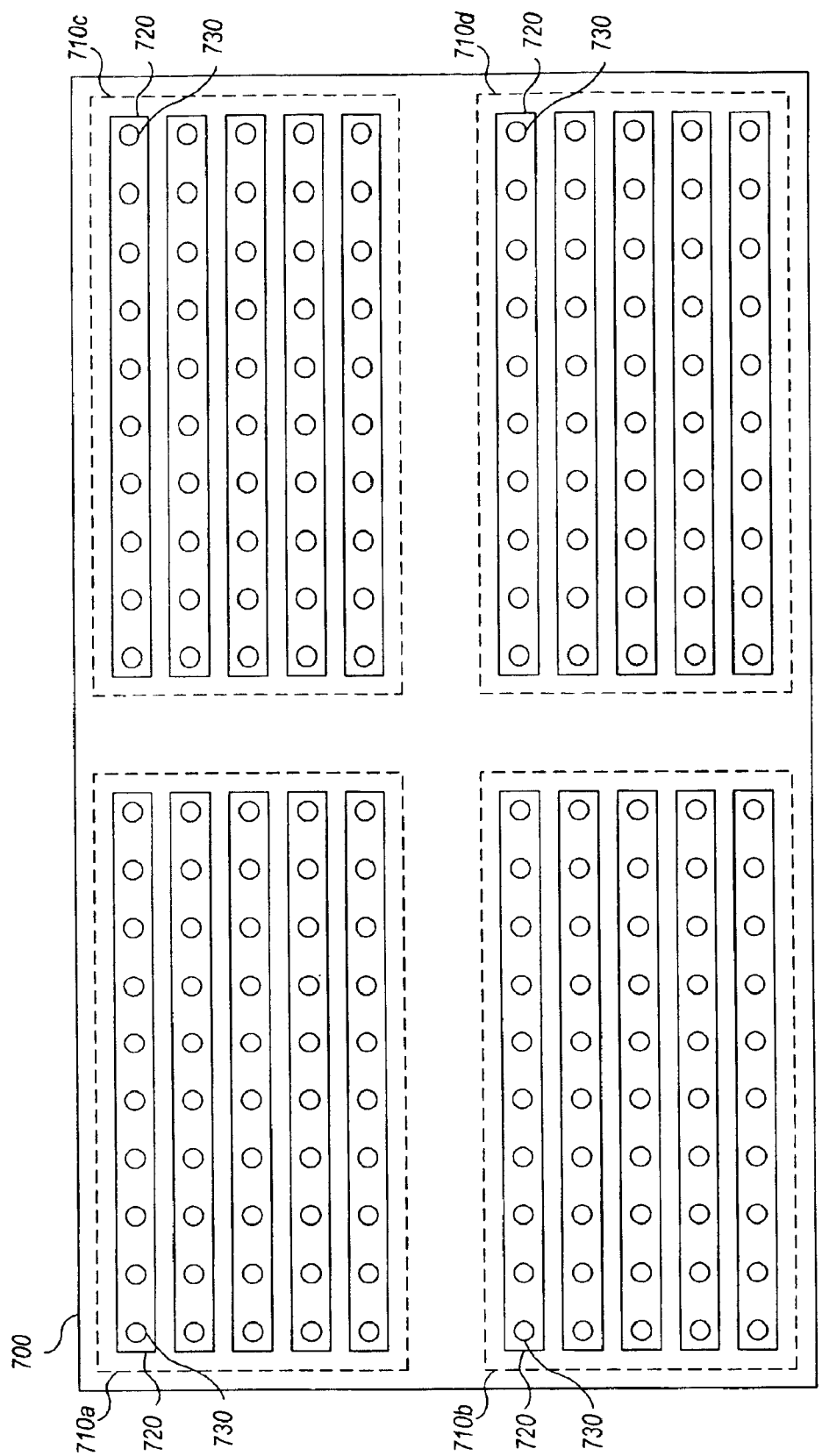
FIG. 13A is a top view of a card bay of a tester, illustrating a tester in which the pins that provide the resources are positioned along an edge of rectangular cards.

In this application, we consider tester machinery 700 where the pins 730 that provide the resources are positioned along an edge of rectangular cards 720. The cards, in turn, are positioned in parallel to each other in 4 quadrants (modules) 710*a*, 710*b*, 710*c*, 710*d*. This is illustrated in FIG. 13A. The goal is to find a pin assignment that minimizes the number of cards 720 used.

Figure 13B:
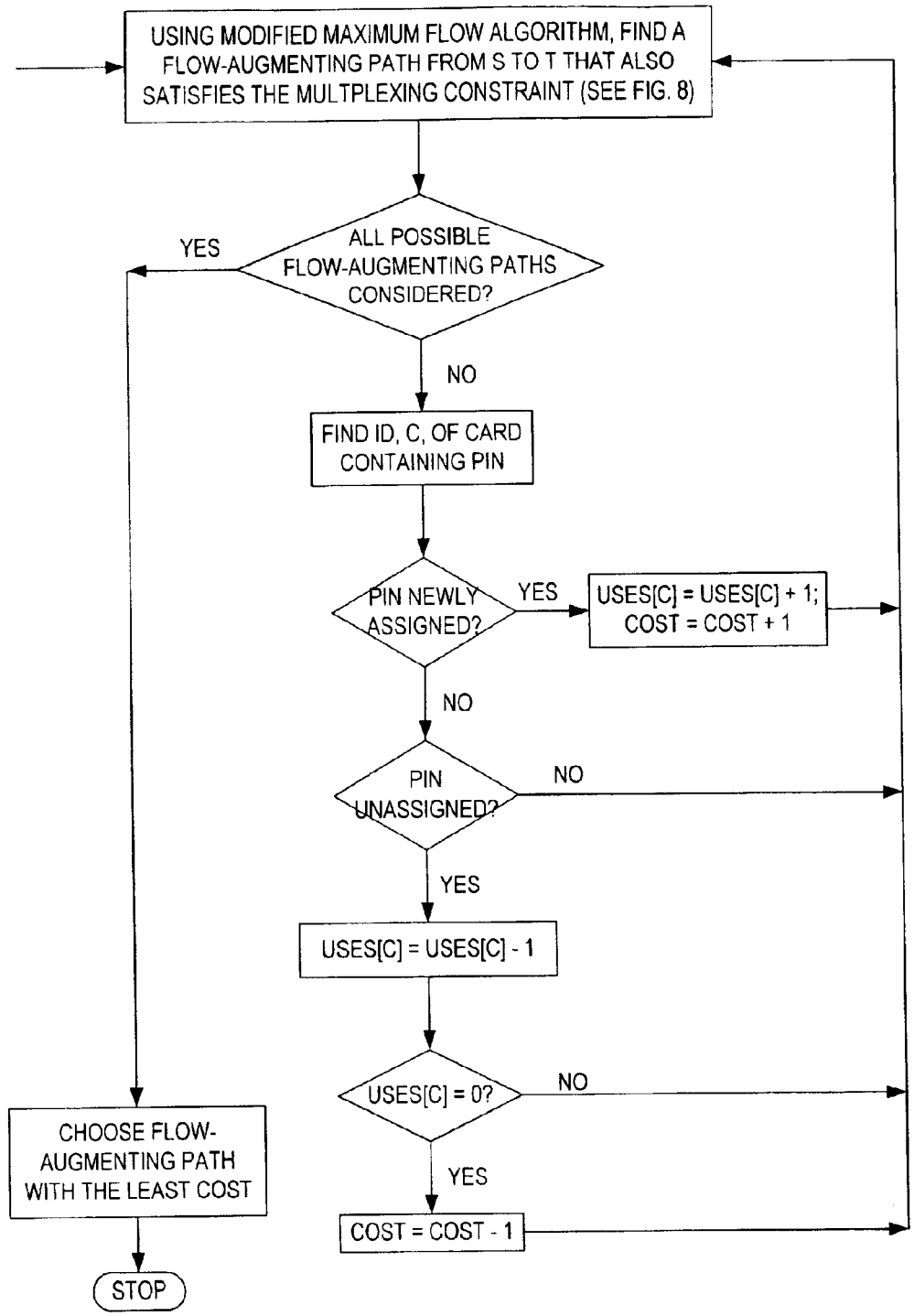
FIG. 13B is a flowchart of a Maximum Flow Algorithm for finding a pin assignment that minimizes the number of pin cards used.

As in the previous case, the Maximum Flow Algorithm of FIG. 11 needs to build a cost function that reflects minimizing the number of cards. This algorithm is shown in FIG. 13B. Accordingly, each time a pin is newly assigned, the algorithm determines its card number, and if the card is not used by the assignments made in previous iterations, it increments the total number of cards used thus far. Otherwise, it increments the number of uses of this card. Accordingly, each time a pin is "un-assigned," the algorithm decrements the number of uses of its card, and when this number reaches zero it decrements the total number of cards.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for assigning tester interface pins to tester fixture probes in a constrained pin-to-probe assignment problem describing a printed circuit board tester environment, said constrained pin-to-probe assignment problem defined by a set of constraints, said set of constraints including: a set of nodes each needing at least one resource, a plurality of tester resources wherein said plurality of resources may comprise a plurality of non-disjoint groupings of resources wherein each grouping realizes a test, a plurality of tester interface pins each connectable to one or more of said tester resources and may be physically grouped into one or more tester modules, said plurality of tester interface pins comprising a plurality of disjoint pin groupings wherein each pin grouping comprises a plurality of tester interface pins that are multiplexed together and that cannot be used simultaneously in any given test, a plurality of probes each connectable to at least one node and to only one of said tester interface pins to deliver a single tester resource to said node during any given test and the same or a different tester resource for any other given test, and wherein no two nodes can share a pin, and a plurality of tests which may include a subset of tests where each test in said subset of tests requires tester resources to be delivered and/or measured from said tester interface pins from a single given module of said one or more tester modules, said method comprising:

modeling said constrained pin-to-probe assignment problem as a Matching Problem that satisfies said set of constraints; and solving said Matching Problem that satisfies said set of constraints to generate a solution to said constrained pin-to-probe assignment problem.

2. A method in accordance with claim 1, wherein:
said solution comprises a maximum matching.

3. A method in accordance with claim 1, wherein:
said solving step generates a plurality of solutions, each said solution having an associated priority.

4. A method in accordance with claim 3, further comprising:

selecting a solution from said plurality of solutions, said selected solution having a corresponding priority that is relatively equal to or higher than each of said respective priorities associated with each other of said plurality of solutions.

5. A method in accordance with claim 1, wherein:
said step for modeling said pin-to-probe assignment problem as a Matching Problem that satisfies said constraints comprises:

for each of said plurality of probes connectable to deliver more than one tester resource:
  for each tester resource greater than one:
    creating a dummy probe, said dummy probe comprising
    a virtual probe that operates as a placemarker for said probe;
    mapping said tester resource to said dummy probe;
    unmapping said tester resource from said probe; and
    associating said dummy probe with said probe; and
wherein said step for solving said Matching Problem that satisfies said set of constraints comprises:
once a solution to said Matching Problem that satisfies said set of constraints is obtained, reassigning each pin in the solution that has been assigned to a dummy probe to the probe associated with the dummy probe and removing said dummy probe from said solution.

6. A method in accordance with claim 1, wherein:
said step for modeling said pin-to-probe assignment problem as a Matching Problem that satisfies said constraints comprises:

for each test in said subset of tests that requires tester resources to be delivered and/or measured from said tester interface pins from a single given module of said one or more tester modules:
  for each module that provides all tester resources required by said test:
    for each said tester resources required by said test:
      for each probe that handles said resource:
        if said probe is unmapped:
          mapping said resource to said probe;
        if said probe is mapped:
          creating a dummy probe;
          mapping said resource to said dummy probe;
          associating said dummy probe with said probe; and
          mapping said dummy probe to said tester interface pins in said module that can connect to said resource in said module; and wherein said step for solving said Matching Problem that satisfies said set of constraints comprises:

once said solution to said constrained pin-to-probe assignment problem is obtained, for each test in said subset of tests that requires tester resources to be delivered and/or measured from said tester interface pins from a single given module of said one or more tester modules:
  selecting one of said modules that provides all tester resources required by said test in which a pin-to-probe assignment solution is found;
  reassigning each pin in said solution that has been assigned to a dummy probe to the probe associated with the dummy probe and removing said dummy probe from said solution;

and for each remaining module that provides all tester resources required by said test, removing all portions of said solution associated with said test from said remaining module.

7. A method in accordance with claim 6, wherein:
said step for selecting one of said modules that provides all tester resources required by said test in which a pin-to-probe assignment solution is found comprises:

selecting said module in which said pin-to-probe assignment solution for said test is the least- or equally-least cost solution.

8. A method in accordance with claim 1, wherein:
for each test:

for each said plurality of disjoint pin groupings wherein each pin grouping comprises a plurality of tester interface pins that are multiplexed together and that cannot be used simultaneously in any given test:
  determining whether said solution to said constrained pin-to-probe assignment problem contains pin-to-probe assignments that include pins from said disjoint pin grouping; and
  if said solution to said constrained pin-to-probe assignment problem contains pin-to-probe assignments that do include pins from said disjoint pin grouping, said step for solving said Matching Problem that satisfies said set of constraints is repeated to generate an alternative solution to said constrained pin-to-probe assignment problem, if said alternative solution exists.

9. A method in accordance with claim 1, wherein said step for solving said Matching Problem that satisfies said set of constraints to generate a solution to said constrained pin-to-probe assignment problem comprises:

initializing said solution to an empty set and a flow associated with said solution to zero;

searching for a flow-augmenting path that satisfies said set of constraints;

if said flow-augmenting path is found, replacing said matching solution with the Exclusive-OR function of the matching solution and the flow-augmenting path;

augmenting said flow along said flow-augmenting path; and repeating said searching step through said repeating step until a flow-augmenting path is not found.

10. A method in accordance with claim 5, wherein:

said step for modeling said pin-to-probe assignment problem as a Matching Problem that satisfies said constraints comprises:

for each test in said subset of tests that requires tester resources to be delivered and/or measured from said tester interface pins from a single given module of said one or more tester modules:

for each module that provides all tester resources required by said test:

for each said tester resources required by said test:

for each probe that handles said resource:

if said probe is unmapped:

mapping said resource to said probe;

if said probe is mapped:

creating a dummy probe;

mapping said resource to said dummy probe;

associating said dummy probe with said probe; and mapping said dummy probe to said tester interface pins in said module that can connect to said resource in said module; and wherein said step for solving said Matching Problem that satisfies said set of constraints comprises:

once said solution to said constrained pin-to-probe assignment problem is obtained, for each test in said subset of tests that requires tester resources to be delivered and/or measured from said tester interface pins from a single given module of said one or more tester modules:

selecting one of said modules that provides all tester resources required by said test in which a pin-to-probe assignment solution is found;

reassigning each pin in said solution that has been assigned to a dummy probe to the probe associated with the dummy probe and removing said dummy probe from said solution;

and for each remaining module that provides all tester resources required by said test, removing all portions of said solution associated with said test from said remaining module.

11. A method in accordance with claim 10, wherein:

said step for selecting one of said modules that provides all tester resources required by said test in which a pin-to-probe assignment solution is found comprises:

selecting said module in which said pin-to-probe assignment solution for said test is the least- or equally-least cost solution.

12. A method in accordance with claim 10, wherein:

for each test:

for each said plurality of disjoint pin groupings wherein each pin grouping comprises a plurality of tester interface pins that are multiplexed together and that cannot be used simultaneously in any given test:

determining whether said solution to said constrained pin-to-probe assignment problem contains pin-to-probe assignments that include pins from said disjoint pin grouping; and if said solution to said constrained pin-to-probe assignment problem contains pin-to-probe assignments that do include pins from said disjoint pin grouping, said step for solving said Matching Problem that satisfies said set of constraints is repeated to generate an alternative solution to said constrained pin-to-probe assignment problem, if said alternative solution exists.

13. A method for assigning tester interface pins to tester fixture probes in a constrained pin-to-probe assignment problem describing a printed circuit board tester environment, said constrained pin-to-probe assignment problem defined by a set of constraints, said set of constraints including: a set of nodes each needing at least one resource, a plurality of tester resources wherein said plurality of resources may comprise a plurality of non-disjoint groupings of resources wherein each grouping realizes a test, a plurality of tester interface pins each connectable to one or more of said tester resources and may be physically grouped into one or more tester modules, said plurality of tester interface pins comprising a plurality of disjoint pin groupings wherein each pin grouping comprises a plurality of tester interface pins that are multiplexed together and that cannot be used simultaneously in any given test, a plurality of probes each connectable to at least one node and to only one of said tester interface pins to deliver a single tester resource to said node during any given test and the same or a different tester resource for any other given test, and wherein no two nodes can share a pin, and a plurality of tests which may include a subset of tests where each test in said subset of tests requires tester resources to be delivered and/or measured from said tester interface pins from a single given module of said one or more tester modules, said method comprising:

modeling said constrained pin-to-probe assignment problem as a Network Flow Problem that satisfies said set of constraints; and solving said Network Flow Problem using a modified Maximum Flow Algorithm that satisfies said set of constraints to generate a solution to said constrained pin-to-probe assignment problem.

14. A method in accordance with claim 13, wherein:

said solution comprises a maximum matching.

15. A method in accordance with claim 13, wherein:

said solving step generates a plurality of solutions, each said solution having an associated priority.

16. A method in accordance with claim 15, further comprising:

selecting a solution from said plurality of solutions, said selected solution having a corresponding priority that is relatively equal to or higher than each of said respective priorities associated with each other of said plurality of solutions.

17. A method in accordance with claim 13, wherein:

said step for modeling said pin-to-probe assignment problem as a Network Flow Problem that satisfies said constraints comprises:

for each of said plurality of probes connectable to deliver more than one tester resource:

for each tester resource greater than one:

creating a dummy probe, said dummy probe comprising a virtual probe that operates as a placemarker for said probe;

mapping said tester resource to said dummy probe;

unmapping said tester resource from said probe; and associating said dummy probe with said probe; and wherein said step for solving said Network Flow Problem that satisfies said set of constraints comprises:

once a solution to said Network Flow Problem that satisfies said set of constraints is obtained, reassigning each pin in the solution that has been assigned to a dummy probe to the probe associated with the dummy probe and removing said dummy probe from said solution.

18. A method in accordance with claim 13, wherein:

said step for modeling said pin-to-probe assignment problem as a Network Flow Problem that satisfies said constraints comprises:

for each test in said subset of tests that requires tester resources to be delivered and/or measured from said tester interface pins from a single given module of said one or more tester modules:

for each module that provides all tester resources required by said test:

for each said tester resources required by said test:

for each probe that handles said resource:

if said probe is unmapped:

mapping said resource to said probe;

if said probe is mapped:

creating a dummy probe;

mapping said resource to said dummy probe;

associating said dummy probe with said probe; and mapping said dummy probe to said tester interface pins in said module that can connect to said resource in said module; and wherein said step for solving said Network Flow Problem that satisfies said set of constraints comprises:

once said solution to said constrained pin-to-probe assignment problem is obtained, for each test in said subset of tests that requires tester resources to be delivered and/or measured from said tester interface pins from a single given module of said one or more tester modules:

selecting one of said modules that provides all tester resources required by said test in which a pin-to-probe assignment solution is found;

reassigning each pin in said solution that has been assigned to a dummy probe to the probe associated with the dummy probe and removing said dummy probe from said solution;

and for each remaining module that provides all tester resources required by said test, removing all portions of said solution associated with said test from said remaining module.

19. A method in accordance with claim 18, wherein:

said step for selecting one of said modules that provides all tester resources required by said test in which a pin-to-probe assignment solution is found comprises:

selecting said module in which said pin-to-probe assignment solution for said test is the least- or equally-least cost solution.

20. A method in accordance with claim 13, wherein:

for each test:

for each said plurality of disjoint pin groupings wherein each pin grouping comprises a plurality of tester interface pins that are multiplexed together and that cannot be used simultaneously in any given test:

determining whether said solution to said constrained pin-to-probe assignment problem contains pin-to-probe assignments that include pins from said disjoint pin grouping; and if said solution to said constrained pin-to-probe assignment problem contains pin-to-probe assignments that do include pins from said disjoint pin grouping, said step for solving said Network Flow Problem that satisfies said set of constraints is repeated to generate an alternative solution to said constrained pin-to-probe assignment problem, if said alternative solution exists.

21. A method in accordance with claim 13, wherein said step for solving said Network Flow Problem that satisfies said set of constraints to generate a solution to said constrained pin-to-probe assignment problem comprises:

initializing said solution to an empty set and a flow associated with said solution to zero;

searching for a flow-augmenting path that satisfies said set of constraints;

if said flow-augmenting path is found, replacing said matching solution with the Exclusive-OR function of the matching solution and the flow-augmenting path;

augmenting said flow along said flow-augmenting path; and repeating said searching step through said repeating step until a flow-augmenting path is not found.

22. A method in accordance with claim 17, wherein:

said step for modeling said pin-to-probe assignment problem as a Network Flow Problem that satisfies said constraints comprises:

for each test in said subset of tests that requires tester resources to be delivered and/or measured from said tester interface pins from a single given module of said one or more tester modules:

for each module that provides all tester resources required by said test:

for each said tester resources required by said test:

for each probe that handles said resource:

if said probe is unmapped:

mapping said resource to said probe;

if said probe is mapped:

creating a dummy probe;

mapping said resource to said dummy probe;

associating said dummy probe with said probe; and mapping said dummy probe to said tester interface pins in said module that can connect to said resource in said module; and wherein said step for solving said Matching Problem that satisfies said set of constraints comprises:

once said solution to said constrained pin-to-probe assignment problem is obtained, for each test in said subset of tests that requires tester resources to be delivered and/or measured from said tester interface pins from a single given module of said one or more tester modules:

selecting one of said modules that provides all tester resources required by said test in which a pin-to-probe assignment solution is found;

reassigning each pin in said solution that has been assigned to a dummy probe to the probe associated with the dummy probe and removing said dummy probe from said solution;

and for each remaining module that provides all tester resources required by said test, removing all portions of said solution associated with said test from said remaining module.

23. A method in accordance with claim 22, wherein:

said step for selecting one of said modules that provides all tester resources required by said test in which a pin-to-probe assignment solution is found comprises:

selecting said module in which said pin-to-probe assignment solution for said test is the least- or equally-least cost solution.

24. A method in accordance with claim 22, wherein:

for each test:

for each said plurality of disjoint pin groupings wherein each pin grouping comprises a plurality of tester interface pins that are multiplexed together and that cannot be used simultaneously in any given test:

determining whether said solution to said constrained pin-to-probe assignment problem contains pin-to-probe assignments that include pins from said disjoint pin grouping; and if said solution to said constrained pin-to-probe assignment problem contains pin-to-probe assignments that do include pins from said disjoint pin grouping, said step for solving said Network Flow Problem that satisfies said set of constraints is repeated to generate an alternative solution to said constrained pin-to-probe assignment problem, if said alternative solution exists.

* * * * *